(12) United States Patent
Fukase et al.

(10) Patent No.: US 9,196,698 B2
(45) Date of Patent: Nov. 24, 2015

(54) SEMICONDUCTOR DEVICE HAVING A GATE DIELECTRIC FILM WHICH IS THINNER BELOW A SOURCE OR DRAIN ELECTRODE THAN BELOW A CHANNEL REGION

(71) Applicant: KABUSHIKI KAISHA TOSHIBA, Minato-ku, Tokyo (JP)

(72) Inventors: Kazuya Fukase, Tokyo (JP); Tatsuya Ohguro, Kanagawa (JP); Hisayo Momose, Kanagawa (JP); Tetsu Morooka, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 42 days.

(21) Appl. No.: 14/104,904

(22) Filed: Dec. 12, 2013

(65) Prior Publication Data

US 2015/0048359 A1 Feb. 19, 2015

(30) Foreign Application Priority Data

Aug. 19, 2013 (JP) .................................. 2013-169465

(51) Int. Cl.
*H01L 29/10* (2006.01)
*H01L 29/51* (2006.01)
*H01L 29/78* (2006.01)
*H01L 29/786* (2006.01)
*H01L 29/423* (2006.01)

(52) U.S. Cl.
CPC ........ *H01L 29/511* (2013.01); *H01L 29/42384* (2013.01); *H01L 29/7839* (2013.01); *H01L 29/7869* (2013.01); *H01L 29/78696* (2013.01)

(58) Field of Classification Search
CPC .............. H01L 29/511; H01L 29/7839; H01L 29/7869
USPC ..................................................... 257/43, 347
See application file for complete search history.

(56) References Cited

U.S. PATENT DOCUMENTS

| 6,225,168 | B1 * | 5/2001 | Gardner et al. ............... 438/287 |
| 8,319,216 | B2 | 11/2012 | Akimoto et al. |
| 2006/0043377 | A1 * | 3/2006 | Hoffman et al. ................ 257/72 |
| 2007/0001241 | A1 * | 1/2007 | Lim et al. ...................... 257/410 |
| 2007/0241327 | A1 * | 10/2007 | Kim et al. ....................... 257/43 |
| 2011/0073837 | A1 * | 3/2011 | Zhou et al. ...................... 257/13 |
| 2012/0153395 | A1 | 6/2012 | Koezuka et al. |
| 2012/0298986 | A1 | 11/2012 | Inoue et al. |

FOREIGN PATENT DOCUMENTS

| JP | 2012-142566 A | 0/7201 |
| JP | 2010-135772 A | 6/2010 |
| JP | 2012-248582 A | 12/2012 |

\* cited by examiner

*Primary Examiner* — Jami M Valentine
(74) *Attorney, Agent, or Firm* — Holtz, Holtz, Goodman & Chick PC

(57) ABSTRACT

A semiconductor device according to an embodiment, includes a source electrode, a drain electrode arranged apart from the source electrode, an oxide semiconductor film, a gate dielectric film, and a gate electrode. The oxide semiconductor film is arranged below the source electrode and the drain electrode to connect the source electrode and the drain electrode. The gate dielectric film is formed below the oxide semiconductor film such that a thickness below at least one of the source electrode and the drain electrode is made thinner than a thickness below a channel region of the oxide semiconductor film between the source electrode and the drain electrode. The gate electrode is arranged below the gate dielectric film and formed in a position where one of portions of the gate electrode overlaps with the source electrode and another one of the portions of the gate electrode overlaps with the drain electrode.

14 Claims, 17 Drawing Sheets

|  | Decrease By 20% from $Id_0$ | Decrease By 10% from $Id_0$ |
|---|---|---|
| Rsd[kΩ] | 25.4 | 10.6 |
| Vg[V] | 12.3 | 20.5 |
| Voltage Ratio To Vg=8V | 1.54 | 2.56 |
| Thickness Ratio Of Gate Dielectric Films At Which Electric Field Strength Equivalent To the Above Voltage Ratio Is Obtained | 0.65 | 0.39 |

FIG. 7

SEMICONDUCTOR DEVICE HAVING A GATE DIELECTRIC FILM WHICH IS THINNER BELOW A SOURCE OR DRAIN ELECTRODE THAN BELOW A CHANNEL REGION

CROSS-REFERENCE TO RELATED APPLICATION

This application is based upon and claims the benefit of priority from Japanese Patent Application No. 2013-169465 filed on Aug. 19, 2013 in Japan, the entire contents of which are incorporated herein by reference.

FIELD

Embodiments described herein relate generally to a semiconductor device.

BACKGROUND

In recent years, thin-film transistors (TFT) using an oxide semiconductor film of InGaZnO as an oxide of indium (In), gallium (Ga), and zinc (Zn) or the like have been developed. The InGaZnO thin-film transistor can be fabricated easily even at low temperature and the mobility thereof is known to be high at 10 cm$^2$/Vs or more. Thus, the realization of BEOL (back end of line) transistors embedded in multilayer interconnection is expected. In addition, the application thereof to the next-generation liquid crystal panels is expected.

In an InGaZnO thin-film transistor, a Schottky junction is formed between InGaZnO and a source or drain electrode (for example, molybdenum (Mo) or tantalum (Ta)) due to a work function difference. Thus, when compared with an ohmic junction, contact resistance increases. In a transistor in which the gate length is, for example, about 10 μm or more, the ratio of channel resistance is sufficiently larger than that of contact resistance and the contact resistance poses no major problem of affecting the drain current. However, with a decreasing channel length accompanying finer patterns, the ratio of the contact resistance increases and a problem of difficulty to secure a sufficient drain current due to the contact resistance may be caused.

BRIEF DESCRIPTION OF THE DRAWINGS

FIG. 7 is a diagram showing an example of each parameter when the drain current decreases by 10% and when the drain current decreases by 20%;

DETAILED DESCRIPTION

A semiconductor device according to an embodiment, includes a source electrode, a drain electrode, an oxide semiconductor film, a gate dielectric film, and a gate electrode. The drain electrode is arranged apart from the source electrode. The oxide semiconductor film is arranged below the source electrode and the drain electrode to connect the source electrode and the drain electrode. The gate dielectric film is formed below the oxide semiconductor film such that a thickness below at least one of the source electrode and the drain electrode is made thinner than a thickness below a channel region of the oxide semiconductor film between the source electrode and the drain electrode. The gate electrode is arranged below the gate dielectric film and formed in a position where one of portions of the gate electrode overlaps with the source electrode and another one of the portions of the gate electrode overlaps with the drain electrode.

A semiconductor device according to an embodiment, includes a source electrode, a drain electrode, an oxide semiconductor film, a gate dielectric film, and a gate electrode. The drain electrode is arranged apart from the source electrode. The oxide semiconductor film is arranged below the source electrode and the drain electrode to connect the source electrode and the drain electrode. The gate dielectric film is formed below the oxide semiconductor film such that a dielectric constant of a region below at least one of the source electrode and the drain electrode is higher than a dielectric constant of a region below a channel region of the oxide semiconductor film between the source electrode and the drain electrode. The gate electrode is arranged below the gate dielectric film and formed in a position where one of portions of the gate electrode overlaps with the source electrode and another one of the portions of the gate electrode overlaps with the drain electrode.

In the embodiments below, semiconductor devices capable of reducing contact resistance between an oxide semiconductor film and a source or drain electrode will be described.

First Embodiment

The first embodiment will be described below using drawings.

Figure 1:
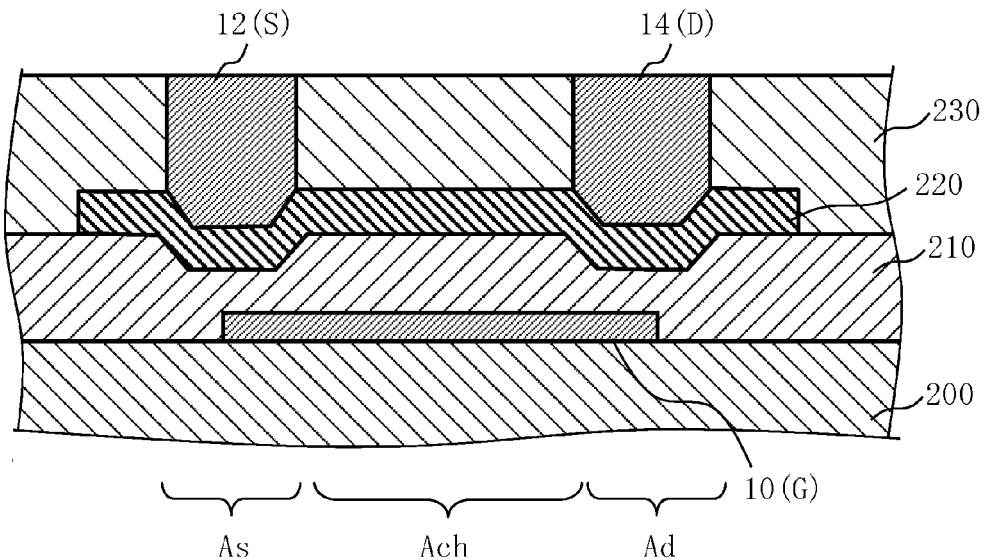
FIG. 1 is a sectional view showing a configuration of a semiconductor device according to a first embodiment.

FIG. 1 is a sectional view showing the configuration of a semiconductor device according to the first embodiment. In FIG. 1, an example of bottom gate type TFT using an oxide semiconductor film such as an InGaZnO film (IGZO film) is shown as a semiconductor device. In FIG. 1, a gate electrode 10 is formed on a substrate 200. As the substrate 200, for example, a silicon substrate made of a silicon wafer of 300 mm in diameter is used. Though not illustrated, wires or various elements may be formed on the substrate 200. In addition, though not illustrated, for example, the gate electrode 10 may be formed in the same layer as a predetermined wire of a multilayer interconnection layer or between layers. In other words, LSI may be formed on an Si substrate to create a thin-film transistor using an oxide semiconductor film in a wiring layer as an upper layer thereof. However, the creation of a transistor is not limited to such an example and a transistor may be formed on an insulating substrate such as a glass.

A gate dielectric film 210 is arranged on the gate electrode 10. The gate dielectric film 210 is formed on the gate electrode 10 and the substrate 200. An oxide semiconductor film 220 is arranged on the gate dielectric film 210. As the oxide semiconductor film 220, for example, an InGaZnO film can suitably be used. In addition to the InGaZnO film, an InZnO film, ZnO film, ZnAlO film, ZnCuO film, NiO film, SnO film, CuO film, GaO film, or InO film can be used. The oxide semiconductor film 220 is suitably formed in a width larger than the width in the gate length direction of, for example, the gate electrode 10.

A dielectric film 230 is arranged on the oxide semiconductor film 220. The dielectric film 230 is formed on the gate dielectric film 210 to cover the oxide semiconductor film 220. In addition, a source electrode 12 and a drain electrode 14 are arranged in the dielectric film 230. The source electrode 12 and the drain electrode 14 are arranged apart from each other (in a non-contact manner). The source electrode 12 is connected to the oxide semiconductor film 220 in a position where at least portion of the source electrode 12 overlaps with one end in the gate length direction of the gate electrode 10. The drain electrode 14 is connected to the oxide semiconductor film 220 in a position where at least portion of the drain electrode 14 overlaps with the other end in the gate length direction of the gate electrode 10. Thus, the oxide semiconductor film 220 is arranged below the source electrode 12 and the drain electrode 14 and the oxide semiconductor film 220 connects the source electrode 12 and the drain electrode 14.

In the first embodiment, regarding the gate dielectric film 210 formed below the oxide semiconductor film 220, the thickness thereof in a region (As) below the source electrode 12 and the thickness thereof in a region (Ad) below the drain electrode 14 are formed thinner than the thickness thereof below a channel region (Ach) of the oxide semiconductor film 220 between the source electrode 12 and the drain electrode 14. In the example of FIG. 1, the thickness of the gate dielectric film 210 is made thinner in both regions (As and Ad) below the source electrode 12 and the drain electrode 14, but the present embodiment is not limited to such an example. The thickness on the lower side of at least one of the source electrode 12 and the drain electrode 14 (As and/or Ad) may be formed thinner than the thickness below the channel region (Ach). In other words, it does not matter whether the portion of the gate dielectric film 210 to be made thinner is only the portion below the source electrode 12, only the portion below the drain electrode 14, or both. By adopting such a configuration, the electric field applied to the oxide semiconductor film 220 below the source or drain electrode becomes stronger so that contact resistance can be reduced by concentration of carriers below the source or drain electrode. As a result, a decrease of the drain current can be inhibited.

The contact resistance as a factor to decrease the drain current has the largest contribution from between the oxide semiconductor film 220 of InGaZnO or the like and the source electrode 12. Thus, it is desirable to make the gate dielectric film 210 at least below the source thinner. The contact resistance between the oxide semiconductor film 220 and the drain electrode 14 is not small and thus, making the portion below the drain electrode 14 thinner is also effective in preventing the drain current from decreasing. On the other hand, a structure in which only the portion below the source electrode 12 is made thinner and the portion below the drain electrode 14 is not made thinner is effective for power devices in which a high voltage is applied to the drain electrode 14. Because the whole gate dielectric film 210 is not made thinner, there is no need to change the design of a gate voltage or the like and the gate capacity can be made not to change significantly.

Figure 2:
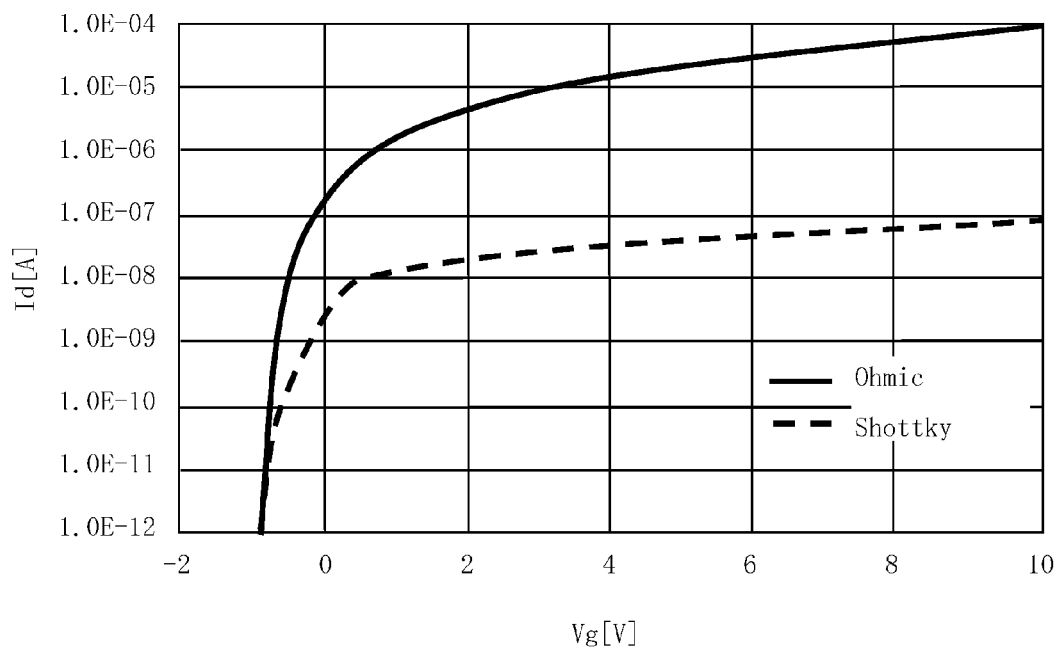
FIG. 2 is a diagram showing an example of simulation results of current characteristics of a gate voltage-drain current in comparative examples of the first embodiment.

FIG. 2 is a diagram showing an example of simulation results of current characteristics of a gate voltage-drain current in comparative examples of the first embodiment. In FIG. 2, simulation results of Id-Vg current characteristics of a case when the contact between the source and drain electrodes and an InGaZnO film is ideally an ohmic junction as a comparative example (1) and a case of a Schottky junction in which the work function difference is 0.3 V as a comparative example (2) are shown. In the comparative examples (1), (2), a case when the gate dielectric film is formed in the same thickness both below the source and drain electrode and below the channel region of an InGaZnO film is assumed. As shown in FIG. 2, it is clear that when compared with the ohmic junction, the Schottky junction greatly decreases the drain current (drive current). It is also clear that the drain current converges to a certain value and reaches a maximum due to contact resistance by the Schottky junction even if the gate voltage is increased.

Figure 3:
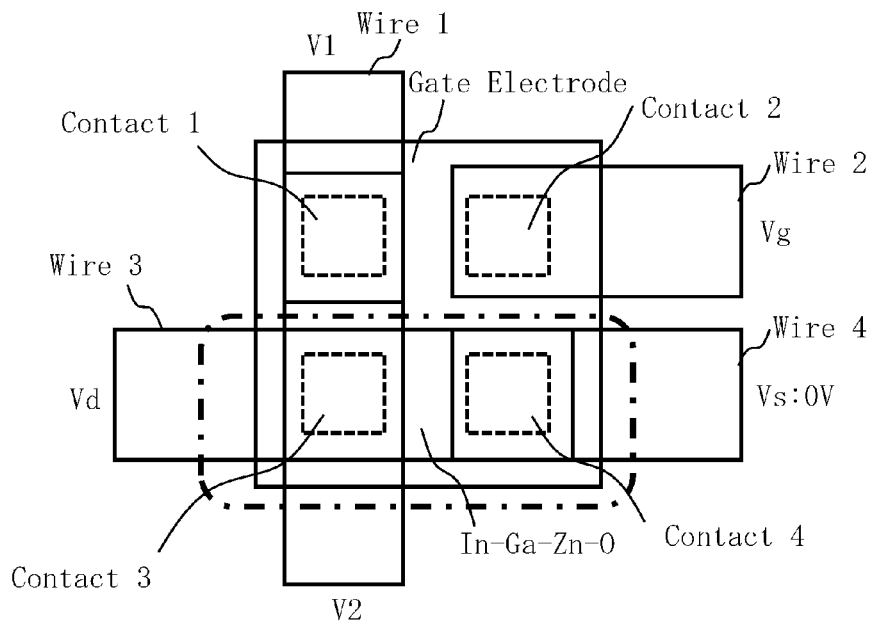
FIG. 3 is a diagram showing an example of contact resistance measuring TEG in TFT.

FIG. 3 is a diagram showing an example of contact resistance measuring TEG in TFT. In FIG. 3, regarding the measuring TEG, a gate electrode is located in the lowest layer and an InGaZnO film is arranged in an L shape via a gate dielectric film (not shown). A dielectric film (not shown) is arranged on the InGaZnO film and four contacts 1 to 4 are opened in the dielectric film. The contact 1 is connected to the InGaZnO film and a wire 1, and the wire 1 and the contact 1 constitute a voltage monitor terminal 1 (applied voltage V1). The contact 2 is connected to the gate electrode and a wire 2, and the gate electrode, the wire 2, and the contact 2 constitute a gate terminal (applied voltage Vg). The contact 3 is connected to the InGaZnO film and a wire 3, and the wire 3 and the contact 3 constitute a drain terminal (applied voltage Vd). The wire 3 and the contact 3 constitute a voltage monitor terminal 2 (applied voltage V2). The contact 4 is connected to the InGaZnO film and a wire 4, and the wire 4 and the contact 4 constitute a source terminal (applied voltage 0 V). That is, the location surrounded by an alternate long and short dash line constitutes a transistor.

If a drain current Id is caused to flow between the source and drain by applying each voltage to the drain terminal and the gate terminal and the voltage is measured in such a way that no current flows to the voltage monitor terminals 1, 2, the potential of InGaZnO of a portion in contact with the contact 3 can be measured by the voltage monitor terminal 1. On the other hand, the potential of the wire 3 (drain terminal) can be measured by the voltage monitor terminal 2. Thus, contact resistance R between InGaZnO and the drain terminal in the contact 3 can be determined by R=(V2−V1)/Id.

Figure 4:
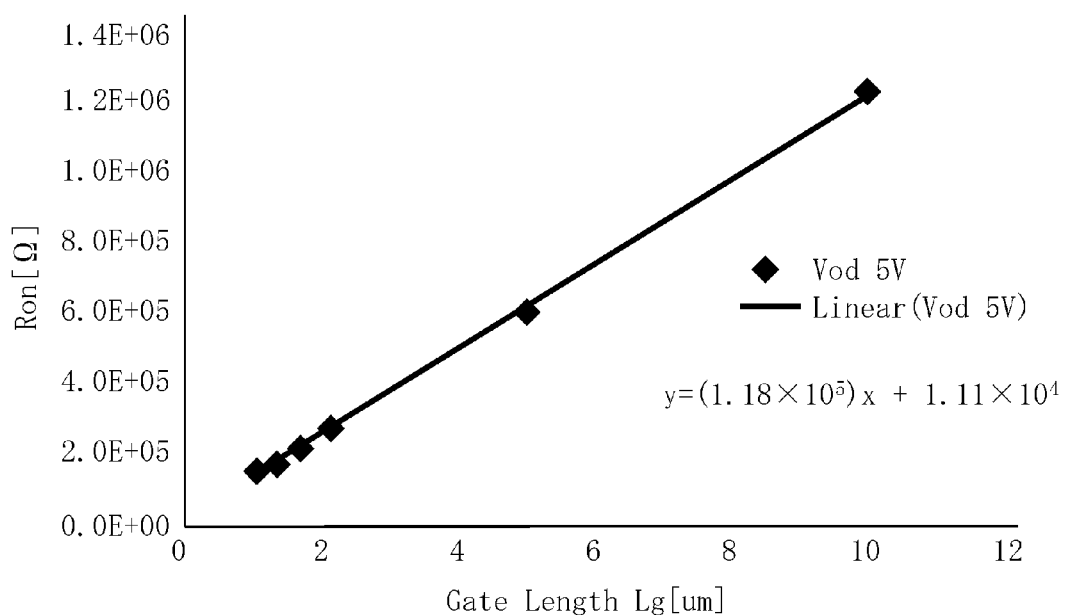
FIG. 4 is a diagram showing an example of a relationship between a gate length and on resistance.

FIG. 4 is a diagram showing an example of the relationship between a gate length and on resistance. In FIG. 4, the vertical axis represents on resistance Ron and the horizontal axis represents a gate length Lg. The example of FIG. 4 shows a graph when the on resistance Ron is plotted by setting the overdrive voltage to 5 V and varying the gate length Lg and approximations by a linear function are made. The on resistance Ron is defined as a value obtained by dividing the drain voltage Vd by the drain current Id. In the example of FIG. 4, $1.18\times10^5 \Omega/\mu m$ is obtained as the channel resistance from the inclination of the graph. The on resistance Ron includes the channel resistance and the contact resistance and, for example, in TEG measurement results shown in FIG. 5 and described below, the contact resistance is conventionally about 53 kΩ and it is clear that the channel resistance and the contact resistance are approximately equal when the gate length Lg is about 1 μm. Thus, if the gate length Lg falls to, for example, 1 μm or less, the influence of the contact resistance on the drain current Id becomes remarkable.

Figure 5:
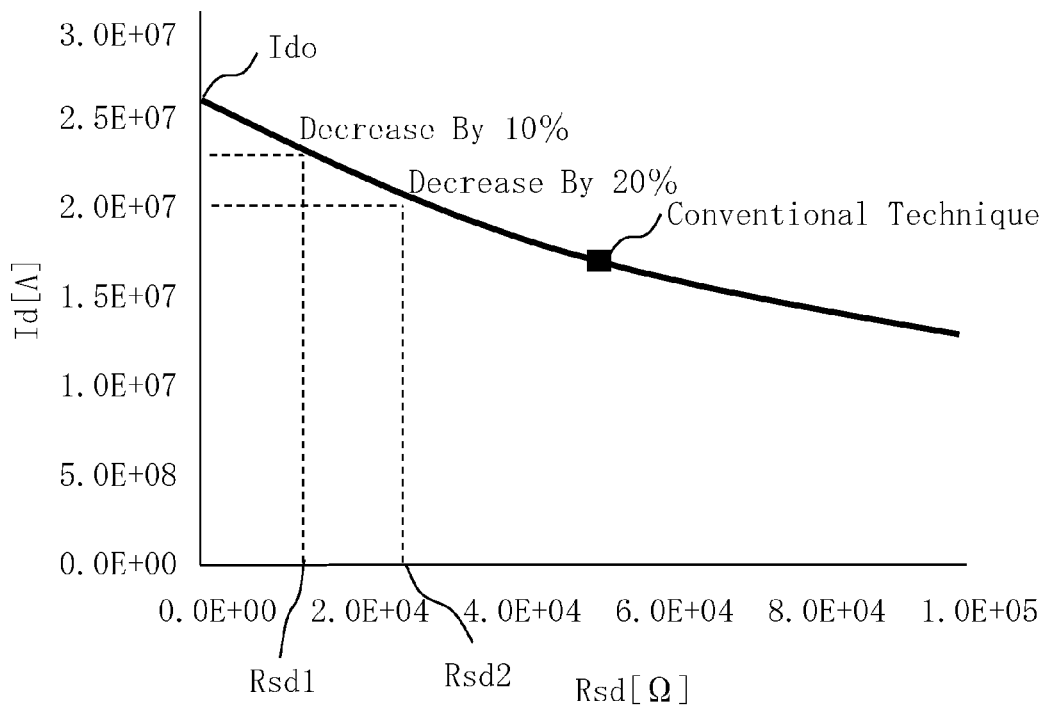
FIG. 5 is a diagram showing an example of the relationship between a drain current and contact resistance.

FIG. 5 is a diagram showing an example of the relationship between the drain current and contact resistance.

FIG. 5 shows an example of calculation results by doing simulations of changes of the drain current Id when contact resistance Rsd and channel resistance Rch are separated based on measurement results of the measuring TEG shown in FIG. 3 and the contact resistance Rsd should be changed. As shown in FIG. 5, the drain current Id decreases with the increasing contact resistance Rsd. FIG. 5 shows a contact resistance value $Rsd_1$ when the drain current Id decreases by 10% compared with a drain current $Id_0$ (vertical axis intercept) when the contact resistance Rsd=0 from the graph in FIG. 5 and a contact resistance value $Rsd_2$ when the drain current Id decreases by 20%.

Figure 6:
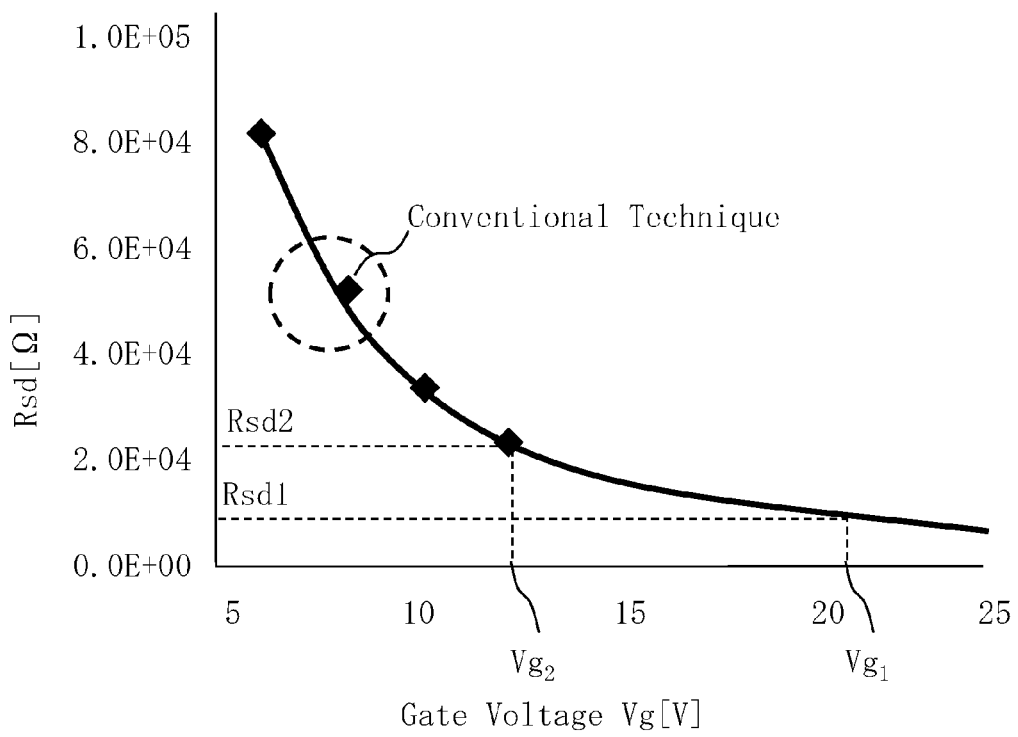
FIG. 6 is a diagram showing an example of the relationship between the contact resistance and a gate voltage.

FIG. 6 is a diagram showing an example of the relationship between the contact resistance and the gate voltage. FIG. 6 shows an example of measurement results of changes of the contact resistance Rsd when the gate voltage Vg changes using the measuring TEG shown in FIG. 3. From the graph shown in FIG. 6, a gate voltage value $Vg_1$ at which the contact resistance value $Rsd_1$ is obtained when the drain current Id obtained from FIG. 5 decreases by 10% and a gate voltage value $Vg_2$ at which the contact resistance value $Rsd_2$ is obtained when the drain current Id decreases by 20% can be obtained by extrapolation.

FIG. 7 is a diagram showing an example of each parameter when the drain current decreases by 10% and when the drain current decreases by 20%. FIG. 7 shows the contact resistance Rsd, the gate voltage Vg, the voltage ratio to Vg=8 V, and the thickness ratio of the gate dielectric film at which electric field strength similar to that of the voltage ratio is obtained when the drain current decreases by 10% and when the drain current decreases by 20%. The thickness ratio of the gate dielectric film can be approximated by the inverse of the voltage ratio.

In the example of FIG. 7, when the drain current decreases by 20%, the contact resistance Rsd is 25.4 kΩ, the gate voltage Vg is 12.3 V, the voltage ratio is 1.54, and the thickness ratio of the gate dielectric film is 0.65. On the other hand, when the drain current decreases by 10%, the contact resistance Rsd is 10.6 kΩ, the gate voltage Vg is 20.5 V, the voltage ratio is 2.56, and the thickness ratio of the gate dielectric film is 0.39.

Thus, it is clear that the thickness ratio of the gate dielectric film below the source and drain electrodes to the thickness of the gate dielectric film in contact with the channel portion has 0.65 as an index when it is assumed that a decrease of the drain current is limited to 20% of the drain current when there is no contact resistance. Also, it is clear that 0.39 becomes an index when it is assumed that a decrease of the drain current is limited to 10% of the drain current when there is no contact resistance.

Therefore, in the first embodiment, the thickness of the gate dielectric film 210 in both regions (As and Ad) below the source electrode 12 and the drain electrode 14 is formed such that the ratio thereof to the thickness below the channel region (Ach) is 0.65 or less. Preferably, the thickness ratio is set to 0.39 or less. By adopting such a configuration, a decrease of the drain current can be inhibited.

Figure 8:
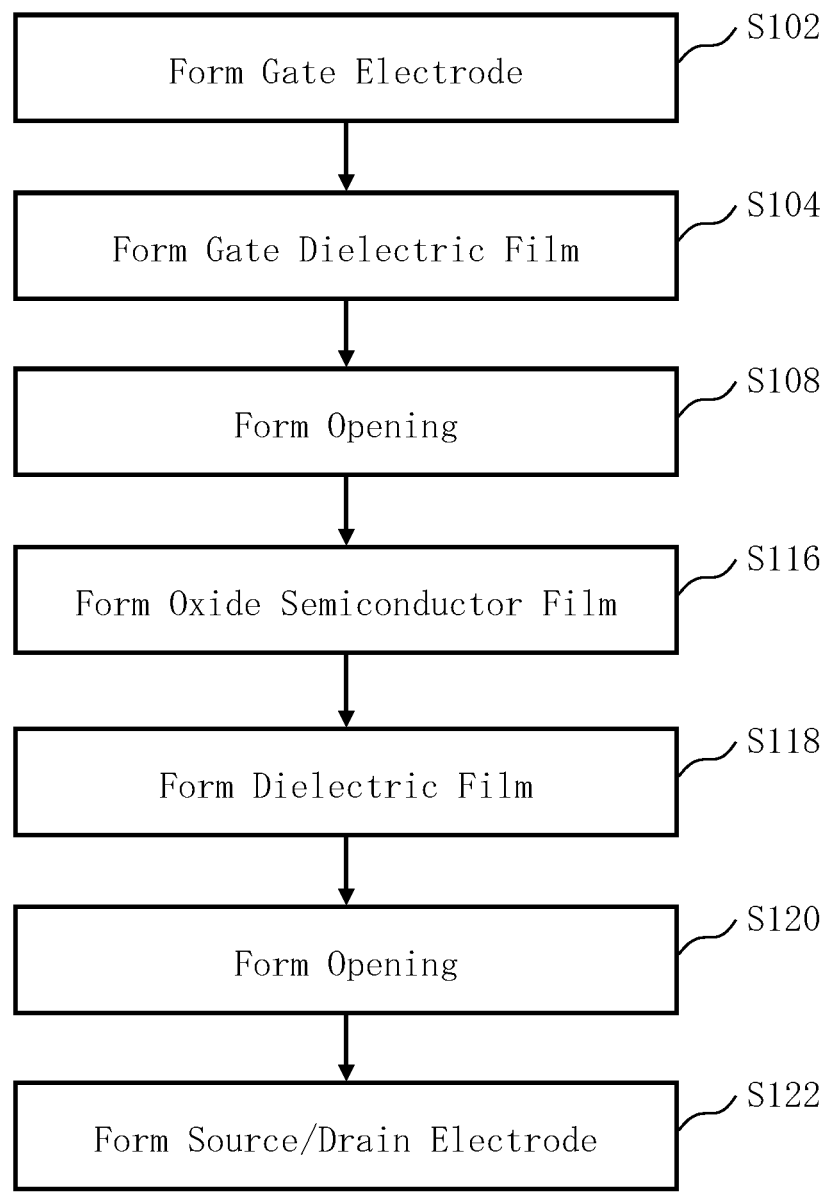
FIG. 8 is a flow chart showing principal processes of a method for fabricating a semiconductor device according to the first embodiment.

FIG. 8 is a flow chart showing principal processes of a method for fabricating a semiconductor device according to the first embodiment. In FIG. 8, the method for fabricating a semiconductor device according to the first embodiment executes a series of processes including a gate electrode formation process (S102), a gate dielectric film formation process (S104), an opening formation process (S108), an oxide semiconductor film formation process (S116), a dielectric film formation process (S118), an opening formation process (S120), and a source/drain electrode formation process (S122).

FIGS. 9A to 9E show process sectional views of the method for fabricating a semiconductor device according to the first embodiment. FIGS. 9A to 9E show the gate electrode formation process (S102) to the source/drain electrode formation process (S122) in FIG. 8.

Figure 9:
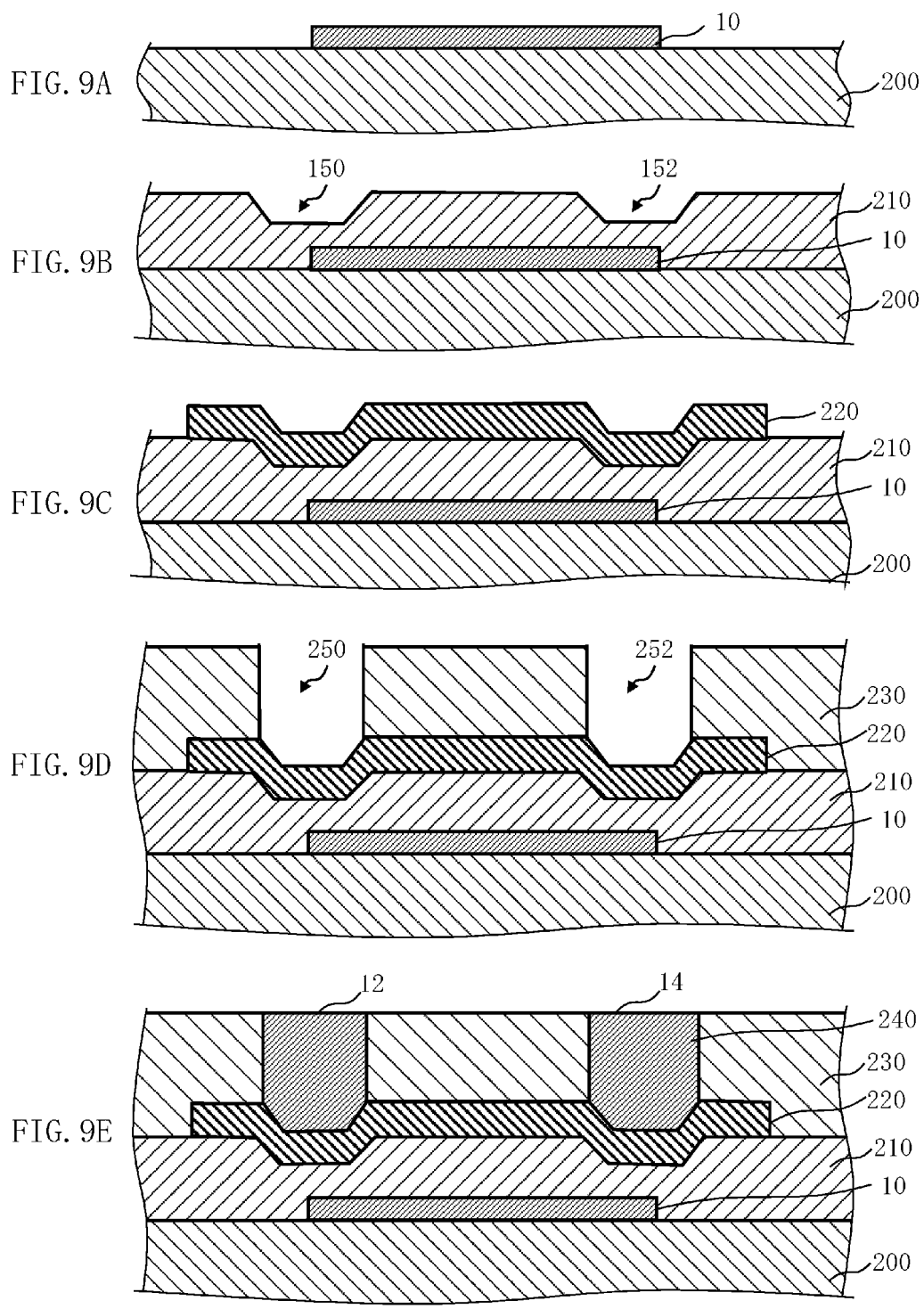
FIGS. 9A to 9E are process sectional views of the method for fabricating a semiconductor device according to the first embodiment.

In FIG. 9A, as the gate electrode formation process (S102), the gate electrode 10 is formed on the substrate 200. For example, an electrode material is deposited on the substrate 200 to a thickness of, for example, 10 to 30 nm using a sputter process. Here, the electrode material is formed to a thickness of, for example, 30 nm. As the electrode material, for example, tantalum (Ta), tantalum nitride (TaN), titanium nitride (TiN), molybdenum (Mo) or the like can be used. As the substrate 200, as described above, for example, a silicon substrate made of a silicon wafer of 300 mm in diameter is used. Though not illustrated, wires or various elements may be formed on the substrate 200. After the deposition, as a patterning process, a resist pattern is formed on the electrode material through a lithography process such as a resist coating process and an exposure process (not shown). Then, as an etching process, the gate electrode 10 can be formed by removing the exposed electrode material by the anisotropic etching method. The gate electrode 10 is formed to a width of, for example, 2 μm or less.

In FIG. 9B, as the gate dielectric film formation process (S104), the gate dielectric film 210 is formed on the gate electrode 10 to a thickness of, for example, 10 to 50 nm using the chemical vapor deposition (CVD) method. Here, the gate dielectric film is formed to a thickness of, for example, 30 nm. As the material of the gate dielectric film 210, for example, silicon oxide ($SiO_2$), silicon nitride (SiN), silicon oxynitride (SiON) or the like can suitably be used. As the formation method, the plasma CVD method or the atomic layer deposition (ALD) or atomic layer chemical vapor deposition (AL-CVD) method can suitably be used.

Next, as the opening formation process (S108), the gate dielectric film 210 below the source and drain of TFT is made thinner than the gate dielectric film 210 below the channel region. More specifically, openings 150, 152 are formed in positions of the source and drain from the gate dielectric film 210 such that the gate dielectric film 210 there has a predetermined thickness. The openings 150, 152 are formed in a size of, for example, 1 μm or less in width. The openings 150, 152 can be formed substantially perpendicularly to the surface of the substrate 200 by removing the exposed gate dielectric film 210 from the substrate 200 having a resist pattern formed on the gate dielectric film 210 through the lithography process such as a resist coating process and exposure process, which are not shown, by the anisotropic etching method. As an example, the openings 150, 152 may be formed by, for example, the reactive ion etching (RIE) method. Here, as described above, the openings 150, 152 are formed such that the gate dielectric film 210 in both regions (As and Ad) of the source electrode and the drain electrode is 0.65 times the thickness below the channel region (Ach) or less. Preferably, the openings 150, 152 are formed such that the thickness ratio is 0.39 or less. On the other hand, the thickness of the gate dielectric film 210 in the regions (As and Ad) of the source and drain is suitably 2.5 nm or more. Accordingly, a leak current to the gate electrode 10 can be prevented.

Here, an example in which the thickness of the gate dielectric film 210 is made thinner in both positions of the source and drain is shown, but the present embodiment is not limited to such an example. The thickness of the gate dielectric film 210 may be made thinner in one of the positions of the source and drain.

In FIG. 9C, as the oxide semiconductor film formation process (S116), the oxide semiconductor film 220 is formed on the gate dielectric film 210 to a thickness of, for example, 10 to 30 nm using, for example, the sputter process. Here, the oxide semiconductor film 220 is formed to a thickness of, for example, 30 nm. The oxide semiconductor film 220 is formed like burying the openings 150, 152 formed in the positions of the source and drain. Then, the oxide semiconductor film 220 having a predetermined size is formed by patterning the oxide semiconductor film 220 so as to leave an active region by the etching method. As the material of the oxide semiconductor film 220, for example, an InGaZnO film can suitably be used. In addition to the InGaZnO film, an InZnO film, ZnO film, ZnAlO film, ZnCuO film, NiO film, SnO film, CuO film, GaO film, or InO film can be used. The oxide semiconductor film 220 is suitably formed in a width larger than the width in the gate length direction of, for example, the gate electrode 10.

In FIG. 9D, as the dielectric film formation process (S118), the dielectric film 230 is formed on the oxide semiconductor film 220 and the gate dielectric film 210 to a thickness of, for example, 100 to 200 nm using the CVD method. Here, the dielectric film 230 is formed on the gate dielectric film 210 to a thickness of, for example, 150 nm. As the material of the dielectric film 230, for example, $SiO_2$, SiN, or SiON is suitably used. As the formation method, the plasma CVD method or the atomic layer deposition (ALD) or atomic layer chemical vapor deposition (ALCVD) method can suitably be used. The dielectric film 230 is formed to cover the oxide semiconductor film 220 and becomes a protective film of the oxide semiconductor film 220.

Next, as the opening formation process (S120), openings 250, 252 are formed so as to pass through the dielectric film 230 from the surface of the dielectric film 230 to the surface of the oxide semiconductor film 220. The opening 250 (contact hole) for the source is formed in a position where at least portion of the source overlaps with one end in the gate length direction of the gate electrode 10. At the same time, the opening 252 (contact hole) for the drain is formed in a position where at least portion of the drain overlaps with the other end in the gate length direction of the gate electrode 10. The openings 250, 252 are formed in a size of, for example, 1 μm or less in width. The openings 250, 252 can be formed substantially perpendicularly to the surface of the substrate 200 by removing the exposed dielectric film 230 from the substrate 200 having a resist pattern formed on the dielectric film 230 through the lithography process such as a resist coating process and exposure process, which are not shown, by the anisotropic etching method. As an example, the openings 250, 252 may be formed by, for example, the reactive ion etching (RIE) method. Incidentally, the region width of the oxide semiconductor film 220 between the source and drain becomes the channel length. In other words, the length between the openings 250, 252 becomes the channel length. Here, the openings 250, 252 are suitably formed so that the channel length is, for example, 1 μm or less.

In FIG. 9E, as the source/drain electrode formation process (S122), an electrode material 240 is first deposited on the dielectric film 230 like completely burying the openings 250, 252 to a thickness of, for example, 200 to 400 nm using the sputter process. Here, the electrode material is deposited to a thickness of, for example, 300 nm. As the electrode material 240, for example, a metal such as Mo, TaN, TiN, aluminum (Al), or ruthenium (Ru) can be used. Alternatively, a plurality of metallic materials may be deposited. After the deposition, as a patterning process, a resist pattern is formed on the electrode material 240 through a lithography process such as a resist coating process and an exposure process (not shown). Then, as an etching process, the source electrode 12 and the drain electrode 14 can be formed by removing the exposed electrode material 240 by the anisotropic etching method. Here, the portion of the source electrode 12 and the drain electrode 14 in the dielectric film 230 is illustrated; however, after the openings 250, 252 being buried, respective electrode portions (not shown) may further be formed on the dielectric film 230.

According to the first embodiment, as described above, the electric field strength can be increased and the contact resistance can be reduced by making the thickness of the gate dielectric film 210 in the regions (As and Ad) below the source electrode 12 and the drain electrode 14 thinner than the thickness below the channel region (Ach). As a result, a decrease of the drain current can be inhibited. In addition, the rate of decrease of the drain current can be controlled by controlling the ratio of the thickness of the gate dielectric film 210 of regions below the source electrode 12 and the drain electrode 14 to the thickness below the channel region (Ach).

Second Embodiment

Although in the first embodiment, the configuration to control the ratio of the thickness of the gate dielectric film 210 of regions below the source electrode 12 and the drain electrode 14 to the thickness below the channel region (Ach) is described, the technique to reduce the contact resistance is not limited to the above example. In the second embodiment, a configuration that reduces the contact resistance by controlling the dielectric constant of a gate dielectric film will be described. Content not specifically described below is the same as in the first embodiment.

Figure 10:
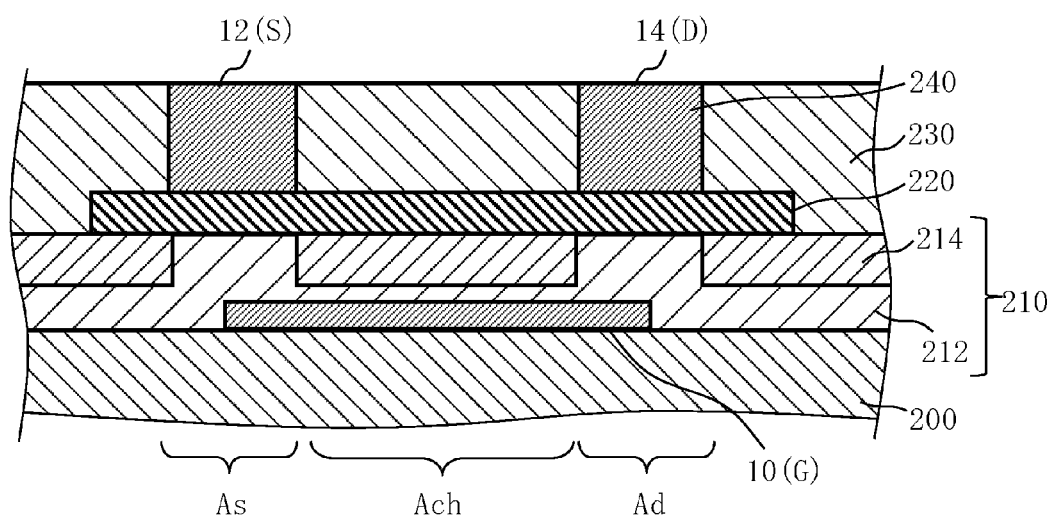
FIG. 10 is a sectional view showing the configuration of the semiconductor device according to a second embodiment.

FIG. 10 is a sectional view showing the configuration of the semiconductor device according to the second embodiment.

In FIG. 10, an example of bottom gate type TFT using an oxide semiconductor film such as an InGaZnO film (IGZO film) is shown as a semiconductor device in the second embodiment. In FIG. 10, the gate electrode 10 is formed on the substrate 200.

A laminated film of a first gate dielectric film 212 and a second gate dielectric film 214 is arranged on the gate electrode 10 and the substrate 200 as the gate dielectric film 210. Here, the first gate dielectric film 212 and the second gate dielectric film 214 are formed such that the dielectric constant of the regions (As and Ad) below the source electrode 12 and the drain electrode 14 is higher than the dielectric constant of the region (Ach) below the channel region of the oxide semiconductor film 220 between the source electrode 12 and the drain electrode 14. In the example of FIG. 10, the gate dielectric film 210 is formed of only the first gate dielectric film 212 for the regions (As and Ad) below the source electrode 12 and the drain electrode 14. For the region (Ach) below the channel region, the gate dielectric film is formed of the laminated film of the first gate dielectric film 212 and the second gate dielectric film 214. However, the method for making the dielectric constant higher is not limited to the above example and if the dielectric constant can be made higher than that of the region (Ach) below the channel region, the gate dielectric film 210 may be formed of a laminated film of the first gate dielectric film 212 and the second gate dielectric film 214 also for the regions (As and Ad) below the source electrode 12 and the drain electrode 14.

The oxide semiconductor film 220 is arranged on the first gate dielectric film 212 in the regions (As and Ad) below the source electrode 12 and the drain electrode 14 and on the second gate dielectric film 214 in the other region. As the oxide semiconductor film 220, for example, an InGaZnO film can suitably be used. In addition to the InGaZnO film, an InZnO film, ZnO film, ZnAlO film, ZnCuO film, NiO film, SnO film, CuO film, GaO film, or InO film can be used. The oxide semiconductor film 220 is suitably formed in a width larger than the width in the gate length direction of, for example, the gate electrode 10.

The dielectric film 230 is arranged on the oxide semiconductor film 220. The dielectric film 230 is formed also on the gate dielectric film 210 to cover the oxide semiconductor film 220. In addition, the source electrode 12 and the drain electrode 14 are arranged in the dielectric film 230. The source electrode 12 and the drain electrode 14 are arranged apart from each other. The source electrode 12 is connected to the oxide semiconductor film 220 in a position where at least a portion of one end in the gate length direction of the gate electrode 10 overlaps. The drain electrode 14 is connected to the oxide semiconductor film 220 in a position where at least a portion of the other end in the gate length direction of the gate electrode 10 overlaps. Thus, the oxide semiconductor film 220 is arranged below the source electrode 12 and the drain electrode 14 to connect the source electrode 12 and the drain electrode 14.

In the second embodiment, the gate dielectric film 210 is formed such that the dielectric constant of the regions (As and Ad) below the source electrode 12 and the drain electrode 14 is higher than the dielectric constant of the region (Ach) below the channel region of the oxide semiconductor film 220 between the source electrode 12 and the drain electrode 14 by combining the first gate dielectric film 212 and the second gate dielectric film 214. It is clear from the results shown in FIG. 7 that the dielectric constant of the regions (As and Ad) below the source electrode 12 and the drain electrode 14 is 1.54 times the dielectric constant of the region (Ach) below the channel region as an index to limit a decrease of the drain current to 20% of the drain current when there is no contact resistance. Also, it is clear that 2.56 times becomes an index to limit a decrease of the drain current to 10% of the drain current when there is no contact resistance.

Thus, in the second embodiment, the dielectric constant of the regions (As and Ad) below the source electrode 12 and the drain electrode 14 are formed so as to be 1.5 times the dielectric constant below the channel region (Ach) or more. Preferably, the dielectric constant of the regions (As and Ad) below the source electrode 12 and the drain electrode 14 are formed so as to be 2.56 times or more. By adopting such a configuration, a decrease of the drain current can be inhibited. For example, sets of the first gate dielectric film 212 and the second gate dielectric film 214 are set as described below to achieve such a dielectric constant ratio. As a first combination, at least one of silicon nitride (SiN) and alumina ($Al_2O_3$) is used for the first gate dielectric film 212. Silicon oxide ($SiO_2$) is used for the second gate dielectric film 214. Using such a first combination, the dielectric constant ratio can be made to be 1.5 times or more. As a second combination, at least one of $Ta_2O_5$, $TiO_2$, and $Y_2O_3$ is used for the first gate dielectric film 212. SiN is used for the second gate dielectric film 214. Using such a second combination, the dielectric constant ratio can be made to be 2 times or more. As a third combination, at least one of $Ta_2O_5$, $TiO_2$, and $Y_2O_3$ is used for the first gate dielectric film 212. $SiO_2$ is used for the second gate dielectric film 214. Using such a third combination, the dielectric constant ratio can be made to be 4 times or more. The thickness ratio when the first gate dielectric film 212 and the second gate dielectric film 214 are stacked may appropriately be set by considering the dielectric constant.

According to the second embodiment, with a gate electric field below the source or drain electrode stronger than that below the channel, the contact resistance between the oxide semiconductor film 220 and the source electrode 12 or the drain electrode 14 can be decreased. It does not matter whether the first gate dielectric film 212 is located only below the source electrode 12, only below the drain electrode 14, or below both of the source and drain electrodes. The contact resistance as a factor to decrease the drain current has the largest contribution from between the oxide semiconductor film 220 and the source electrode 12. Thus, it is desirable to use the first gate dielectric film 212 having a high dielectric constant for at least a portion below the source electrode 12. The contact resistance between the oxide semiconductor film 220 and the drain electrode 14 is not small and thus, it is more effective to use the first gate dielectric film 212 also below the drain electrode 14 in preventing the drain current from decreasing. The first gate dielectric film 212 may not be present outside below the source or drain electrode. In such a case, the ratio of the dielectric film of a high dielectric constant in a transistor decreases, which achieves an effect of lowering the wire capacity.

TFT using the oxide semiconductor film 220 such as InGaZnO is a transistor of electronic funds and thus, the applied voltage to each electrode is like, for example, 0 V to the source, 10 V to the drain, and 10 V to the gate. Therefore, the electric field between source and gate electrodes becomes the strongest. In this case, if a structure having the first gate dielectric film 212 below the source electrode 12 is adopted, the gate dielectric film 210 between the source and drain electrodes is not made thinner than other portions like in the first embodiment and thus, resistance to voltage of the source is improved when compared with the first embodiment.

Because a transistor having the gate dielectric film 210 formed by using $SiO_2$ generally has good noise properties, the contact resistance can be decreased without damaging noise properties of the transistor by using a dielectric film having a dielectric constant higher than $SiO_2$ for the first gate dielectric film 212 and using $SiO_2$ for the second gate dielectric film 214.

Figure 11:
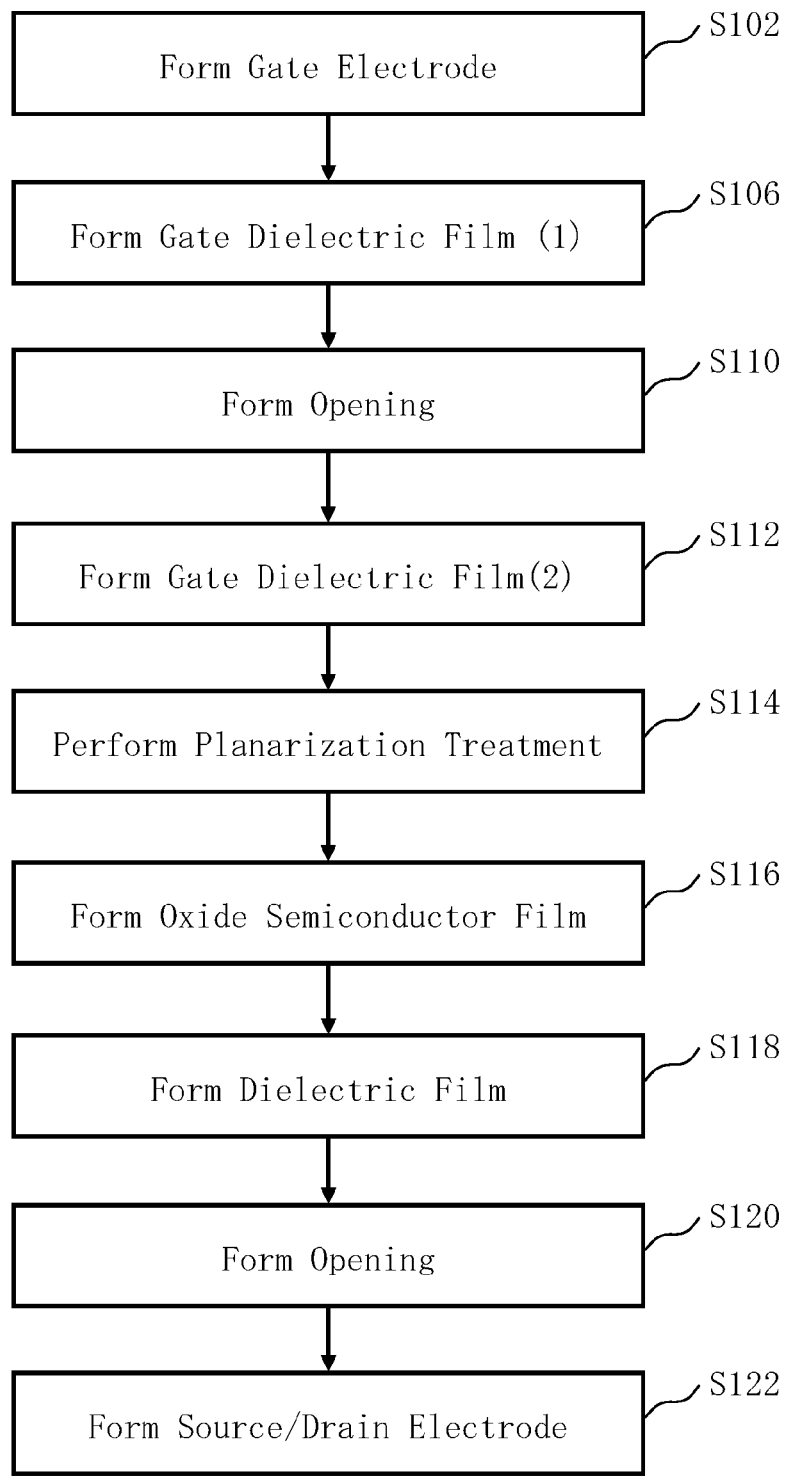
FIG. 11 is a flow chart showing principal processes of the method for fabricating a semiconductor device according to the second embodiment.

FIG. 11 is a flow chart showing principal processes of the method for fabricating a semiconductor device according to the second embodiment. In FIG. 11, the method for fabricating a semiconductor device according to the second embodiment executes a series of processes including the gate electrode formation process (S102), a gate dielectric film (1) formation process (S106), an opening formation process (S110), a gate dielectric film (2) formation process (S112), a planarization process (S114), the oxide semiconductor film formation process (S116), the dielectric film formation process (S118), the opening formation process (S120), and the source/drain electrode formation process (S122).

FIGS. 12A to 12F show process sectional views of the method for fabricating a semiconductor device according to the second embodiment. FIGS. 12A to 12F show the gate electrode formation process (S102) to the source/drain electrode formation process (S122) in FIG. 11.

Figure 12:
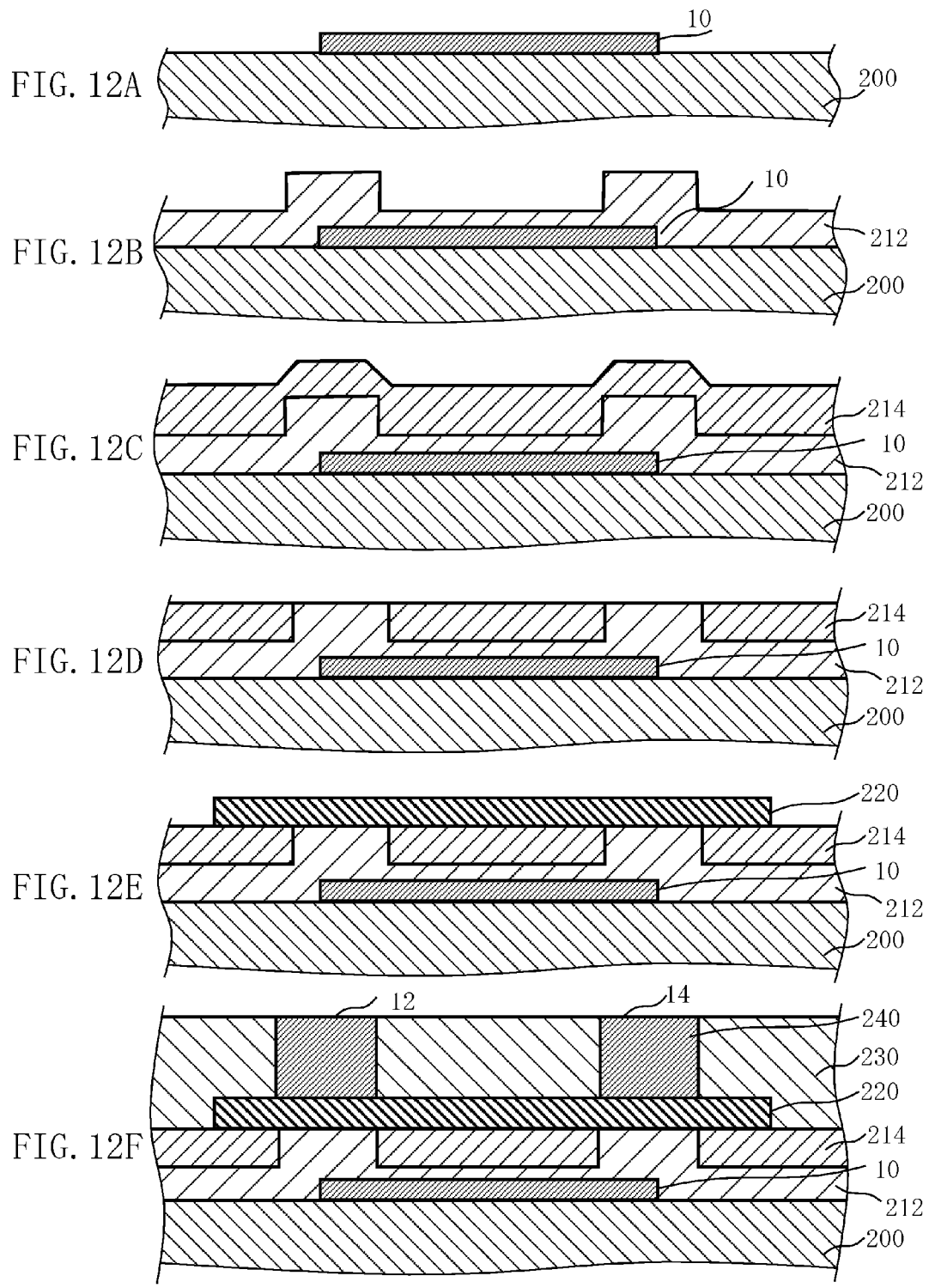
FIGS. 12A to 12F are process sectional views of the method for fabricating a semiconductor device according to the second embodiment.

In FIG. 12A, as the gate electrode formation process (S102), the gate electrode 10 is formed on the substrate 200. The content of the gate electrode formation process (S102) is the same as in the first embodiment.

In FIG. 12B, as the gate dielectric film (1) formation process (S106), the first gate dielectric film 212 is formed on the gate electrode 10 to a thickness of, for example, 10 to 50 nm using the chemical vapor deposition (CVD) method. Here, the first gate dielectric film is formed to a thickness of, for example, 30 nm. As the material of the first gate dielectric film 212, for example, at least one of SiN and $Al_2O_3$ is used. Alternatively, at least one of $Ta_2O_5$, $TiO_2$, and $Y_2O_3$ is used. As the formation method, the plasma CVD method or the atomic layer deposition (ALD) or atomic layer chemical vapor deposition (ALCVD) method can suitably be used.

Next, as opening formation process (S110), an opening is formed by etching the first gate dielectric film 212 in regions other than regions below the source and drain. The opening can be formed substantially perpendicularly to the surface of the substrate 200 by removing the exposed first gate dielectric film 212 from the substrate 200 having a resist pattern formed on the first gate dielectric film 212 through the lithography process such as a resist coating process and exposure process, which are not shown, by the anisotropic etching method. As an example, the opening may be formed by, for example, the reactive ion etching (RIE) method. In regions other than regions below the source and drain, as described above, the first gate dielectric film 212 may be left or completely removed.

In FIG. 12C, as the gate dielectric film (2) formation process (S112), the second gate dielectric film 214 is formed on the first gate dielectric film 212 to a thickness of, for example, 10 to 50 nm using the CVD method. Here, the second gate dielectric film 214 is formed to a thickness of, for example, 30 nm. If the first gate dielectric film 212 is completely removed in regions other than regions below the source and drain in the opening formation process (S110), the second gate dielectric film 214 may be formed on the first gate dielectric film 212, the exposed oxide semiconductor film 220, and the substrate 200 to a thickness of, for example, 10 to 50 nm. If, as the material of the first gate dielectric film 212, for example, at least one of SiN and $Al_2O_3$ is used, $SiO_2$ is used for the second gate dielectric film 214. If at least one of $Ta_2O_5$, $TiO_2$, and $Y_2O_3$ is used for the first gate dielectric film 212, SiN or $SiO_2$ is used for the second gate dielectric film 214. As the formation method, the plasma CVD method or the atomic layer deposition (ALD) or atomic layer chemical vapor deposition (ALCVD) method can suitably be used.

In FIG. 12D, as the planarization process (S114), the excessive second gate dielectric film 214 protruding from the opening is removed by polishing until the surface of the first gate dielectric film 212 is exposed for planarization using the chemical-mechanical polishing (CMP) method. Using such a process, the second gate dielectric film 214 having a low dielectric constant can be removed from regions below the source and drain.

In FIG. 12E, as the oxide semiconductor film formation process (S116), the oxide semiconductor film 220 is formed on the first gate dielectric film 212 and the second gate dielectric film 214 to a thickness of, for example, 10 to 30 nm using the sputter process. Here, the oxide semiconductor film 220 is formed to a thickness of, for example, 30 nm. Then, the oxide semiconductor film 220 having a predetermined size is formed by patterning the oxide semiconductor film 220 so as to leave an active region by the etching method. The oxide semiconductor film 220 may as well be formed in a width wider than the gate electrode 10 in the gate length direction. Other content is the same as in the first embodiment.

In FIG. 12F, as the dielectric film formation process (S118), the dielectric film 230 is formed on the oxide semiconductor film 220 and the second gate dielectric film 214 to a thickness of, for example, 100 to 200 nm using the CVD method. Other content is the same as in the first embodiment.

Next, as the opening formation process (S120), an opening is formed so as to pass through the dielectric film 230 from the surface of the dielectric film 230 to the surface of the oxide semiconductor film 220. The content of the opening formation process (S120) may be same as in the first embodiment.

Then, as the source/drain electrode formation process (S122), the source electrode 12 and the drain electrode 14 are formed like completely burying openings for the source/drain. The content of the source/drain electrode formation process (S122) is the same as in the first embodiment.

Third Embodiment

In the third embodiment, a configuration that makes, like in the first embodiment, a gate dielectric film below the source/drain thinner than a channel region and also makes the dielectric constant of the gate dielectric film below the source/drain higher than that of the channel region will be described. Content not specifically described below is the same as in the first embodiment or the second embodiment.

Figure 13:
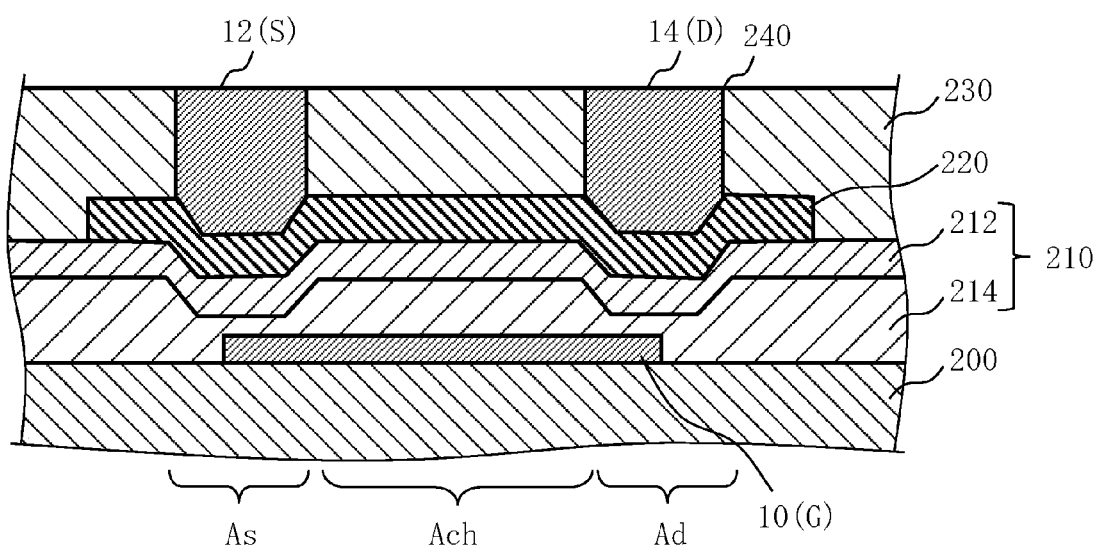
FIG. 13 is a sectional view showing the configuration of the semiconductor device according to a third embodiment.

FIG. 13 is a sectional view showing the configuration of the semiconductor device according to the third embodiment. In FIG. 13, an example of bottom gate type TFT using an oxide semiconductor film such as an InGaZnO film (IGZO film) is shown as a semiconductor device in the third embodiment. In FIG. 13, the gate electrode 10 is formed on the substrate 200. A laminated film of the first gate dielectric film 212 and the second gate dielectric film 214 is arranged on the gate electrode 10 and the substrate 200 as the gate dielectric film 210. In the third embodiment, contrary to the second embodiment, the second gate dielectric film 214 having a low dielectric constant is stacked so as to be arranged on the lower-layer side and the first gate dielectric film 212 having a high dielectric constant is stacked so as to be arranged on the upper-layer side. Here, the first gate dielectric film 212 and the second gate dielectric film 214 are formed such that the dielectric constant of the regions (As and Ad) below the source electrode 12 and the drain electrode 14 is higher than the dielectric constant of the region (Ach) below the channel region of the oxide semiconductor film 220 between the source electrode 12 and the drain electrode 14. In the example of FIG. 13, the thickness of the second gate dielectric film 214 on the lower-layer side in the regions (As and Ad) below the source electrode 12 and the drain electrode 14 is formed so as to be thinner than the thickness of the second gate dielectric film 214 in the region (Ach) below the channel region. By adopting such a configuration, the amount of the first gate dielectric film 212 becomes larger in the gate dielectric film 210 formed in the regions (As and Ad) below the source electrode 12 and the drain electrode 14 than in the region (Ach) below the channel region. Thus, the dielectric constant of the gate dielectric film 210 below the source/drain can be made higher than that below the channel region.

An oxide semiconductor film 220 is arranged on the first gate dielectric film 212. As the oxide semiconductor film 220, for example, an InGaZnO film can suitably be used. In addition to the InGaZnO film, an InZnO film, ZnO film, ZnAlO film, ZnCuO film, NiO film, SnO film, CuO film, GaO film, or InO film can be used. The oxide semiconductor film 220 is suitably formed in a width larger than the width in the gate length direction of, for example, the gate electrode 10.

The dielectric film 230 is arranged on the oxide semiconductor film 220. The dielectric film 230 is formed also on the gate dielectric film 210 to cover the oxide semiconductor film 220. In addition, the source electrode 12 and the drain electrode 14 are arranged in the dielectric film 230. The source electrode 12 and the drain electrode 14 are arranged apart from each other. The source electrode 12 is connected to the oxide semiconductor film 220 in a position where at least a portion of one end in the gate length direction of the gate electrode 10 overlaps. The drain electrode 14 is connected to the oxide semiconductor film 220 in a position where at least a portion of the other end in the gate length direction of the gate electrode 10 overlaps. Thus, the oxide semiconductor film 220 is arranged below the source electrode 12 and the drain electrode 14 to connect the source electrode 12 and the drain electrode 14.

Sets of the first gate dielectric film 212 and the second gate dielectric film 214 are the same as in the second embodiment.

According to the third embodiment, the gate electric field below the source or drain electrode can be made stronger than that below the channel by controlling the thickness and the dielectric constant of the gate dielectric film 210. Therefore, the contact resistance between the oxide semiconductor film 220 and the source electrode 12 or the drain electrode 14 can be decreased. In addition, effects of the first and second embodiments can be achieved.

Figure 14:
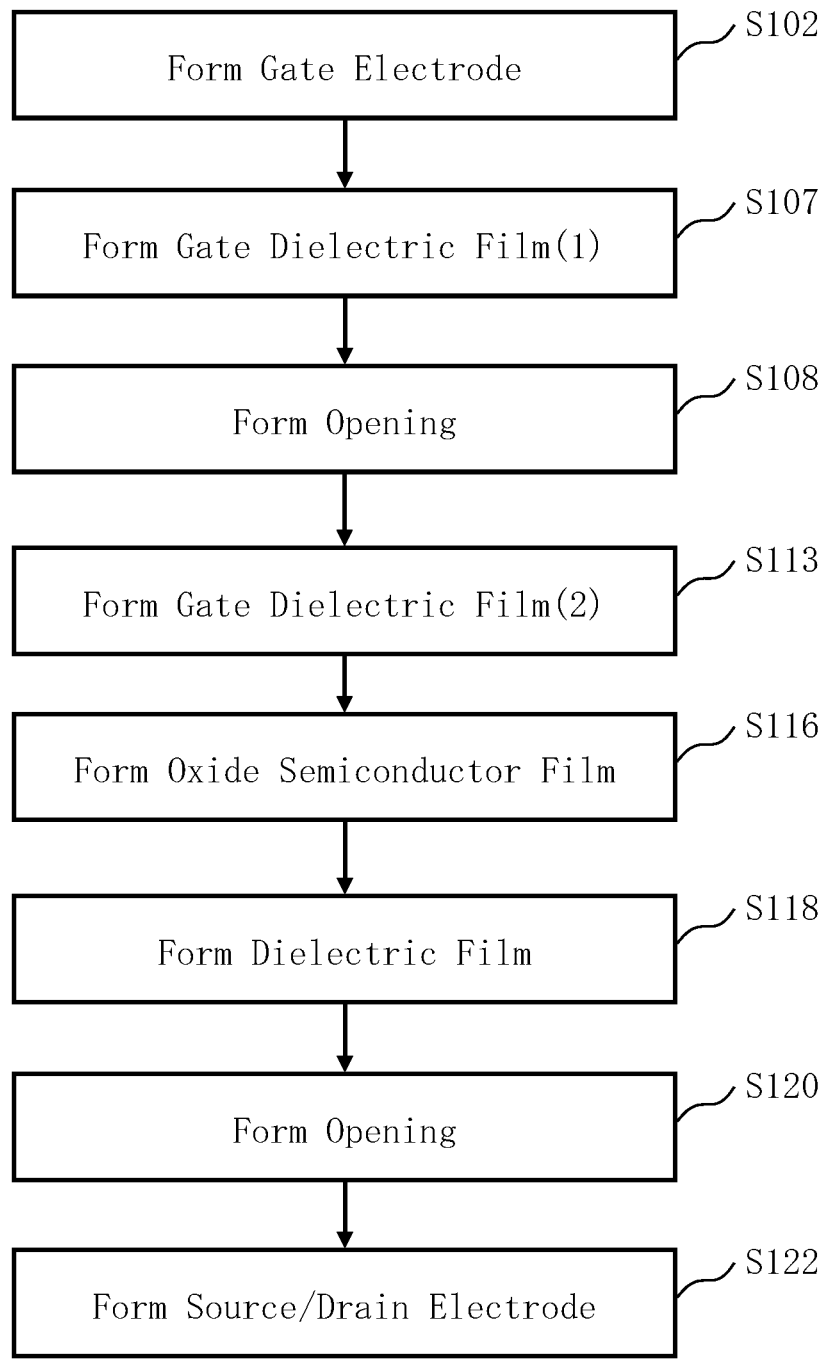
FIG. 14 is a flow chart showing principal processes of the method for fabricating a semiconductor device according to the third embodiment.

FIG. 14 is a flow chart showing principal processes of the method for fabricating a semiconductor device according to the third embodiment. In FIG. 14, the method for fabricating a semiconductor device according to the third embodiment executes a series of processes including the gate electrode formation process (S102), a gate dielectric film (1) formation process (S107), the opening formation process (S108), a gate dielectric film (2) formation process (S113), the oxide semiconductor film formation process (S116), the dielectric film formation process (S118), the opening formation process (S120), and the source/drain electrode formation process (S122).

FIGS. 15A to 15E show process sectional views of the method for fabricating a semiconductor device according to the third embodiment. FIGS. 15A to 15E show the gate electrode formation process (S102) to the source/drain electrode formation process (S122) in FIG. 14.

Figure 15A:
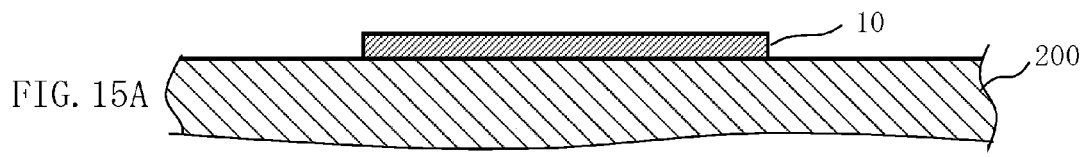
FIGS. 15A to 15E are process sectional views of the method for fabricating a semiconductor device according to the third embodiment.

In FIG. 15A, as the gate electrode formation process (S102), the gate electrode 10 is formed on the substrate 200. The content of the gate electrode formation process (S102) is the same as in the first embodiment.

Figure 15B:
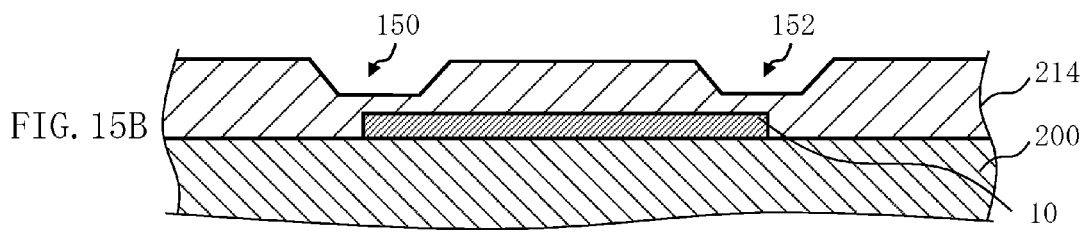

In FIG. 15B, as the gate dielectric film (1) formation process (S107), the second gate dielectric film 214 is formed on the gate electrode 10 to a thickness of, for example, 10 to 30 nm using the chemical vapor deposition (CVD) method. Here, the second gate dielectric film 214 is formed to a thickness of, for example, 20 nm. The material and the formation method of the second gate dielectric film 214 are the same as in the second embodiment.

Next, as the opening formation process (S108), the second gate dielectric film 214 below the source and drain is made thinner than the second gate dielectric film 214 corresponding to the channel region of the oxide semiconductor film 220. More specifically, the openings 150, 152 are formed in positions of the source and drain from the second gate dielectric film 214 such that the second gate dielectric film 214 there has a predetermined thickness. The openings 150, 152 are formed in a size of, for example, 1 μm or less in width. The openings 150, 152 can be formed substantially perpendicularly to the surface of the substrate 200 by removing the exposed second gate dielectric film 214 from the substrate 200 having a resist pattern formed on the second gate dielectric film 214 through the lithography process such as a resist coating process and exposure process, which are not shown, by the anisotropic etching method. As an example, the openings 150, 152 may be formed by, for example, the reactive ion etching (RIE) method.

Here, an example in which the thickness of the second gate dielectric film 214 is made thinner in both positions of the source and drain is shown, but the present embodiment is not limited to such an example. The thickness of the second gate dielectric film 214 may be made thinner in one of the positions of the source and drain.

Figure 15C:
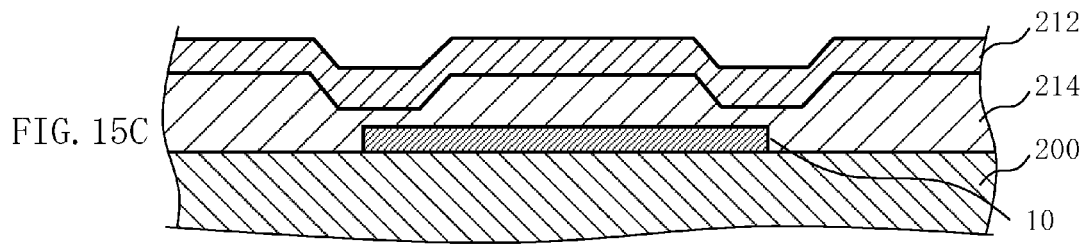

In FIG. 15C, as the gate dielectric film (2) formation process (S113), the first gate dielectric film 212 is formed on the second gate dielectric film 214 to a thickness of, for example, 10 to 30 nm using the CVD method. Here, the first gate dielectric film 212 is formed to a thickness of, for example, 20 nm. If the second gate dielectric film 214 is completely removed in regions below the source and drain in the opening formation process (S108), the first gate dielectric film 212 may be formed on the second gate dielectric film 214, the exposed oxide semiconductor film 220, and the substrate 200 to a thickness of, for example, 10 to 30 nm. The material and the formation method of the first gate dielectric film 212 are the same as in the second embodiment.

Figure 15D:
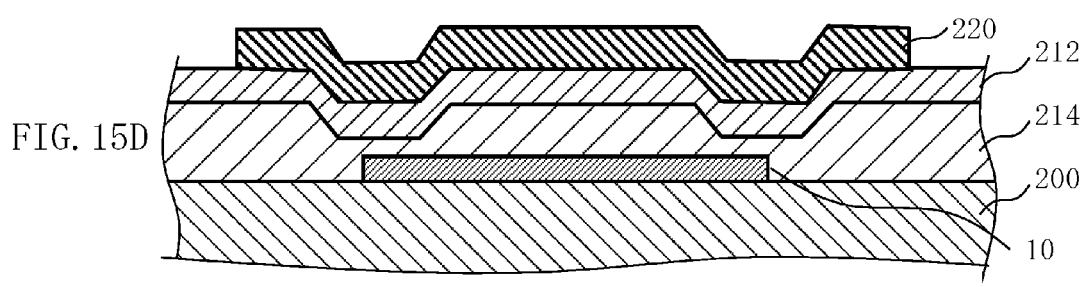

In FIG. 15D, as the oxide semiconductor film formation process (S116), the oxide semiconductor film 220 is formed on the first gate dielectric film 212 to a thickness of, for example, 10 to 30 nm using the sputter process. Here, the oxide semiconductor film 220 is formed to a thickness of, for example, 30 nm. The oxide semiconductor film 220 is formed like burying the openings 150, 152 formed in the positions of the source and drain. Then, the oxide semiconductor film 220 having a predetermined size is formed by patterning the oxide semiconductor film 220 so as to leave an active region by the etching method. The oxide semiconductor film 220 may as well be formed in a width larger than the width in the gate length direction of, for example, the gate electrode 10. Other content is the same as in the first embodiment.

Figure 15E:
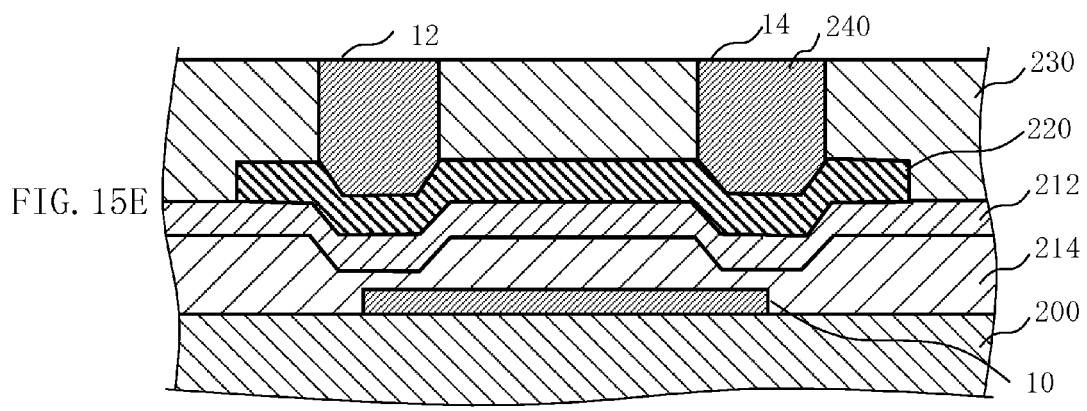

In FIG. 15E, as the dielectric film formation process (S118), the dielectric film 230 is formed on the oxide semiconductor film 220 and the first gate dielectric film 212 to a thickness of, for example, 100 to 200 nm using the CVD method. Other content is the same as in the first embodiment.

Next, each of the opening formation process (S120) and the source/drain electrode formation process (S122) is executed. The content of the opening formation process (S120) and the source/drain electrode formation process (S122) is the same as in the first embodiment.

Fourth Embodiment

In the fourth embodiment, a configuration that forms the gate electrode 10 using an embedded structure using copper (Cu) as the material of the gate electrode 10. Content not specifically described below is the same as in the first embodiment.

Figure 16:
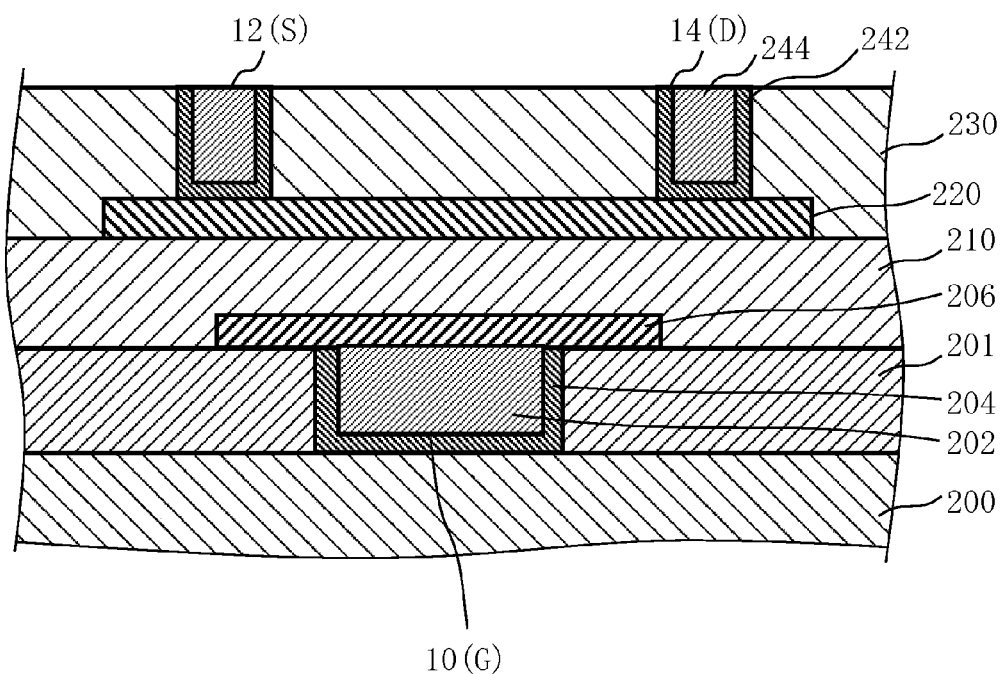
FIG. 16 is a sectional view showing the basic configuration of the semiconductor device according to a fourth embodiment.

FIG. 16 is a sectional view showing the basic configuration of the semiconductor device according to the fourth embodiment. In FIG. 16, an example of bottom gate type TFT using an oxide semiconductor film such as an InGaZnO film (IGZO film) is shown as a semiconductor device. In FIG. 16, a dielectric film 201 is formed on the substrate 200. Cu as the gate electrode 10 is embedded such that the surface (top surface) of Cu is formed in the same height position as the top surface of the dielectric film 201. In addition, though not illustrated, for example, the gate electrode 10 may be formed in the same layer as a predetermined wire of a multilayer interconnection layer or between layers.

To prevent diffusion of Cu used as the material of the gate electrode 10 to the surroundings thereof, a barrier metal film 204 is arranged like surrounding the side face and the bottom of a Cu film 202. As the material of the barrier metal film 204, titanium (Ti), Ta, TaN, tungsten (W), TiN, tungsten nitride (WN), or a laminated film combining these materials such as Ta and TaN can be used.

Further, a conductive barrier metal film 206 (cap film) is arranged to cover the top surface of the Cu film 202 to a thickness of, for example, 5 to 10 nm. The barrier metal film 206 is formed wider than an embedded structure of Cu. As the material of the barrier metal film 206, Ti, Ta, TaN, W, TiN, WN, or a laminated film combining these materials such as Ta and TaN can be used.

The gate dielectric film 210 is arranged on the barrier metal film 206. The gate dielectric film 210 is formed on the barrier metal film 206 and the dielectric film 201. The oxide semiconductor film 220 is arranged on the gate dielectric film 210. As the oxide semiconductor film 220, for example, an InGaZnO film can suitably be used. In addition to the InGaZnO film, an InZnO film, ZnO film, ZnAlO film, ZnCuO film, NiO film, SnO film, CuO film, GaO film, or InO film can be used. The oxide semiconductor film 220 is suitably formed in a width larger than the width in the gate length direction of, for example, the barrier metal film 206 that will constitute a portion of the gate electrode 10.

The dielectric film 230 is arranged on the oxide semiconductor film 220. The dielectric film 230 is formed also on the gate dielectric film 210 to cover the oxide semiconductor film 220. In addition, the source electrode 12 and the drain electrode 14 are arranged in the dielectric film 230. The source electrode 12 and the drain electrode 14 are arranged apart from each other. The source electrode 12 is connected to the oxide semiconductor film 220 in a position where at least a portion of one end in the gate length direction of the barrier metal film 206 that will constitute a portion of the gate electrode 10 overlaps. The drain electrode 14 is connected to the oxide semiconductor film 220 in a position where at least a portion of the other end in the gate length direction of the barrier metal film 206 that will constitute a portion of the gate electrode 10 overlaps. Thus, the oxide semiconductor film 220 is arranged below the source electrode 12 and the drain electrode 14 to connect the source electrode 12 and the drain electrode 14. Here, Cu is also used as the material of the source electrode 12 and the drain electrode 14. When Cu is used, a barrier metal film 242 is arranged like surrounding the side face and the bottom of a Cu film 244 constituting each of the source electrode 12 and the drain electrode 14 to prevent diffusion of Cu to the surroundings thereof. As the material of the barrier metal film 242, titanium (Ti), Ta, TaN, tungsten (W), TiN, tungsten nitride (WN), or a laminated film combining these materials such as Ta and TaN can be used.

In FIG. 16, when the barrier metal film 206 is not arranged, materials of the gate dielectric film 210 are limited to those capable of preventing diffusion of Cu to prevent diffusion of Cu. For example, SiN or the like is used. Further, the thickness of the gate dielectric film 210 is limited to a thickness capable of preventing diffusion of Cu or more. Thus, it becomes difficult to make the gate dielectric film 210 thinner like in the aforementioned first embodiment and it is difficult to reduce contact resistance. In the fourth embodiment, by contrast, as shown in FIG. 16, the top surface of the Cu film 202 to be the gate electrode 10 is covered with the barrier metal film 206 having a wider width than the Cu film 202. Upward diffusion of Cu is thereby prevented. As a result, limitations on materials of the gate dielectric film 210 can be removed. Further, limitations on the thickness of the gate dielectric film 210 to prevent Cu diffusion can be removed and thus, when compared with a case in which the barrier metal film 206 is not arranged, the thickness of the gate dielectric film 210 can be made thinner. As a result, the contact resistance between the source electrode 12 and the drain electrode 14, and the oxide semiconductor film 220 can be reduced. Further, the barrier metal film 206 is conducting to the Cu film 202 to integrally constitute the gate electrode 10 and thus, the gate length and the gate width (size in the depth direction of the drawing) can be widened (controlled) by the width of the barrier metal film 206 regardless of the width dimension of the Cu film 202. Thus, the size of the Cu film 202 may be small. In other words, the size in the channel length direction of the Cu film 202 to be the gate electrode 10 is formed so as to be shorter than the channel length and the size in the channel length direction of the barrier metal film 206 formed on the Cu film 202 and covering the top surface of the Cu film 202 is formed so as to be longer than the channel length.

FIGS. 17A to 17D show a portion of process sectional views of the method for fabricating a semiconductor device according to the fourth embodiment.

Figure 17A:
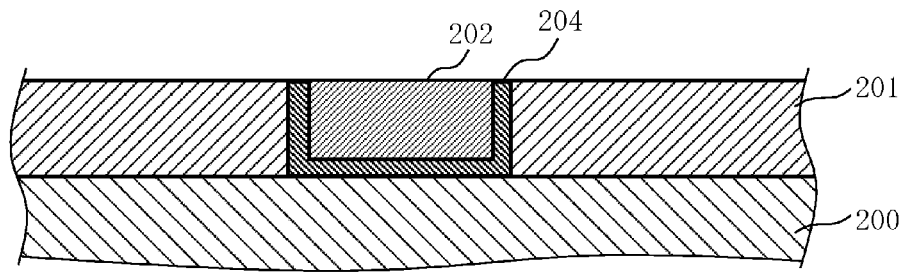
FIGS. 17A to 17D are a portion of process sectional views of the method for fabricating a semiconductor device according to the fourth embodiment.

In FIG. 17A, as a dielectric film formation process, the dielectric film 201 is formed on a substrate 200 using, for example, the CVD method. As the dielectric film 201, for example, SiO$_2$ is used.

Next, as a gate electrode formation process, a Cu wire to be the gate electrode 10 is formed by a damascene process. That is, first an opening (groove) is formed in the dielectric film 201 by lithography and an etching process. Next, the barrier metal film 204 for the prevention of Cu diffusion is deposited on the dielectric film 201 and the side face and the bottom of the opening to a thickness of, for example, 5 to 10 nm using, for example, the sputter process. As the barrier metal film 204, as described above, Ti, Ta, TaN, W, TiN, WN, or a laminated film combining these materials such as Ta and TaN can be used. Here, for example, TaN is used. Then, after a thin Cu film to be a seed film being formed on the barrier metal film 204 using, for example, the sputter process, the Cu film 202 is formed like burying the opening to a thickness of a few hundred nm by the electro-plating method. Then, the excessive Cu film 202 and the barrier metal film 204 protruding from the opening are removed by polishing using the CMP method. Accordingly, the embedded structure of Cu is formed inside the dielectric film 201.

Figure 17B:
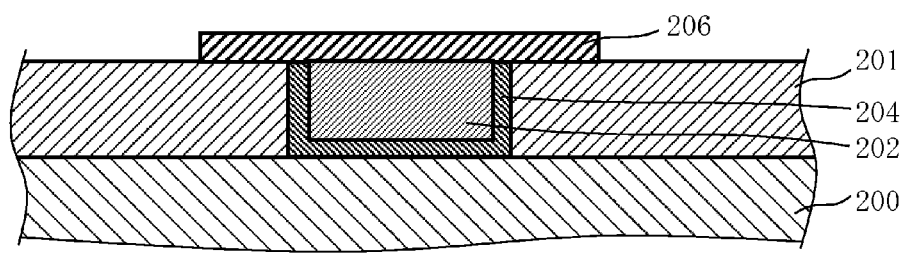

In FIG. 17B, as a barrier metal film formation process, the barrier metal film 206 is formed on the embedded structure of Cu and the dielectric film 201 to a thickness of, for example, 5 to 10 nm. Then, the barrier metal film 206 having a predetermined size is formed by patterning using the etching method such that the Cu film 202 is completely covered with the barrier metal film 206 having a size larger than the width dimension of the embedded structure of Cu.

Figure 17C:
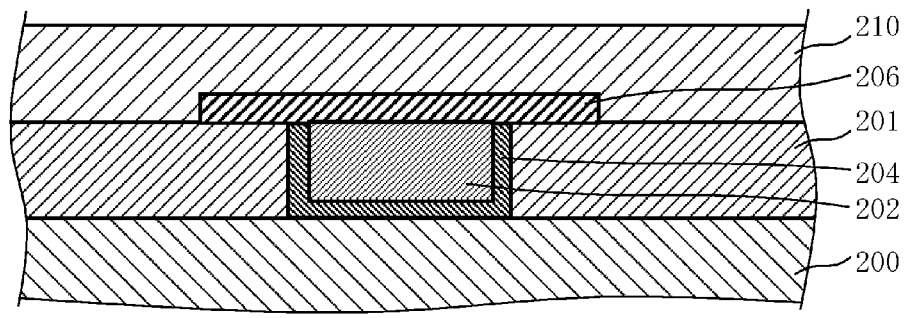

In FIG. 17C, as a gate dielectric film formation process, the gate dielectric film 210 is formed on the barrier metal film 206 and the dielectric film 201 to a thickness of, 10 to 50 nm using the CVD method. Here, the gate dielectric film is formed to a thickness of, for example, 30 nm. The material and the formation method of the gate dielectric film 210 are the same as in the first embodiment.

Figure 17D:
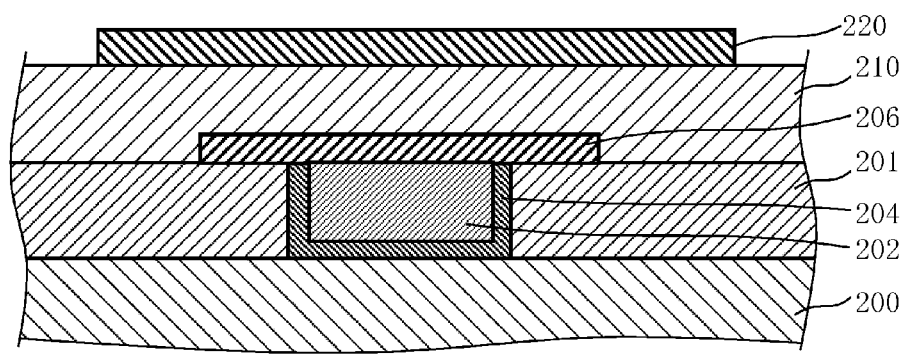

In FIG. 17D, as an oxide semiconductor film formation process, the oxide semiconductor film 220 is formed on the gate dielectric film 210 to a thickness of, for example, 10 to 30 nm using the sputter process. Here, the oxide semiconductor film 220 is formed to a thickness of, for example, 30 nm. Then, the oxide semiconductor film 220 having a predetermined size is formed by patterning the oxide semiconductor film 220 so as to leave an active region by the etching method. The oxide semiconductor film 220 may as well be formed to a width wider than that of the barrier metal film 206. Other content is the same as in the first embodiment.

Figure 18A:
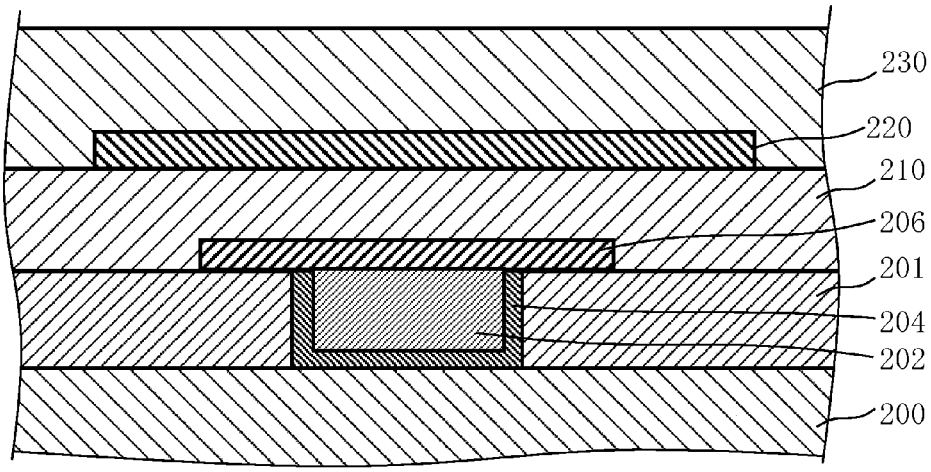
FIGS. 18A and 18B are another portion of process sectional views of the method for fabricating a semiconductor device according to the fourth embodiment.
Figure 18B:
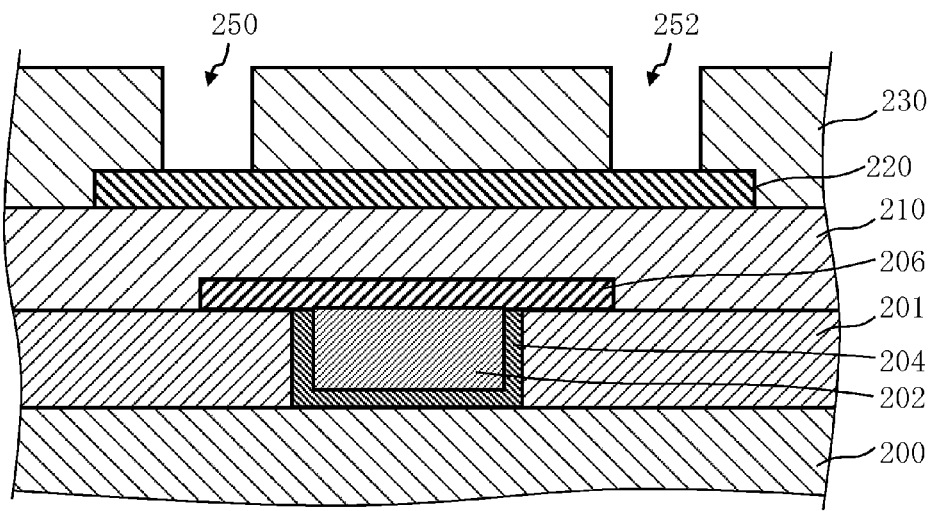

FIGS. 18A and 18B show another portion of process sectional views of the method for fabricating a semiconductor device according to the fourth embodiment.

In FIG. 18A, as a dielectric film formation process, the dielectric film 230 is formed on the oxide semiconductor film 220 and the gate dielectric film 210 to a thickness of, for example, 100 to 200 nm using the CVD method. Here, the dielectric film 230 is formed on the gate dielectric film 210 to a thickness of, for example, 150 nm. The materials of the dielectric film 230 are the same as in the first embodiment. The dielectric film 230 is formed to cover the oxide semiconductor film 220 and becomes a protective film of the oxide semiconductor film 220.

In FIG. 18B, as an opening formation process, openings are formed so as to pass through the dielectric film 230 from the surface of the dielectric film 230 to the surface of the oxide semiconductor film 220. The opening 250 (contact hole) for the source is formed in a position where at least a portion of one end in the gate length direction of the barrier metal film 206 constituting a portion of the gate electrode 10 overlaps. At the same time, the opening 252 (contact hole) for the drain is formed in a position where at least a portion of the other end in the gate length direction of the barrier metal film 206 constituting a portion of the gate electrode 10 overlaps. Other content is the same as in the first embodiment.

Then, as a source/drain electrode formation process, first the barrier metal film 242 for the prevention of Cu diffusion is deposited on the dielectric film 230 and the side face and the bottom of the openings 250, 252 to a thickness of, for example, 5 to 10 nm using, for example, the sputter process. As the barrier metal film 242, as described above, Ti, Ta, TaN, W, TiN, WN, or a laminated film combining these materials such as Ta and TaN can be used. Here, for example, TaN is used. Then, after a thin Cu film to be a seed film being formed on the barrier metal film 242 using, for example, the sputter process, the Cu film 244 is formed like burying the openings to a thickness of a few hundred nm by the electro-plating method. Then, the excessive Cu film 244 and the barrier metal film 242 protruding from the openings 250, 252 are removed by polishing using the CMP method. Accordingly, as shown in FIG. 16, the source electrode 12 and the drain electrode 14 of Cu embedded in the dielectric film 230 can be formed.

Because limitations on the material and the thickness of the gate dielectric film 210 for the prevention of Cu diffusion are removed by covering the Cu film 202 with the barrier metal film 206, the first to third embodiments can be made applicable even when Cu is used as the gate electrode material.

Figure 19:
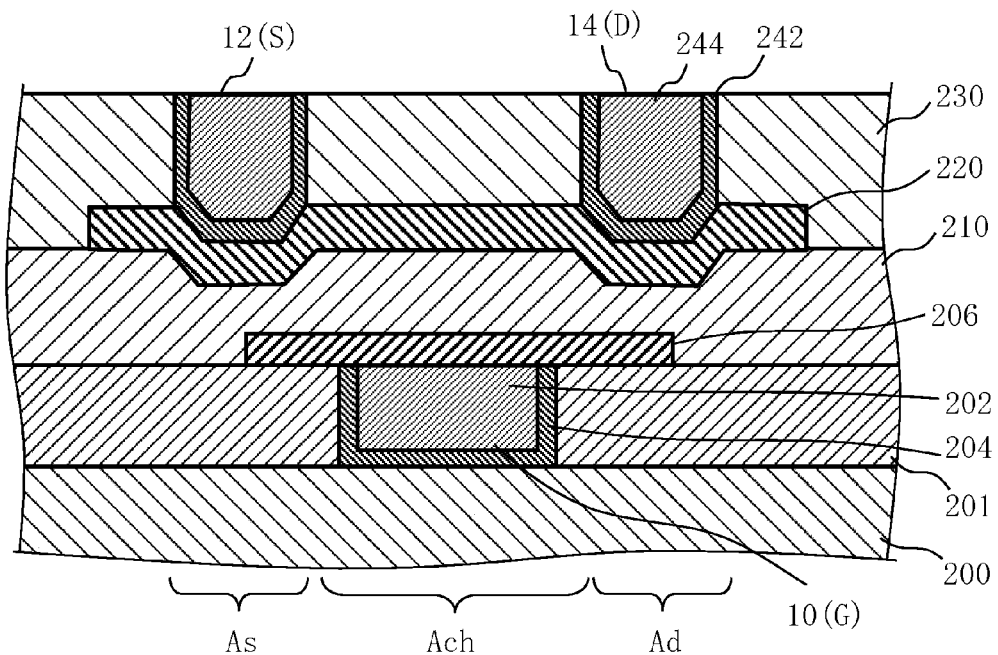
FIG. 19 is a sectional view showing an example of the configuration of the semiconductor device according to the fourth embodiment.

FIG. 19 is a sectional view showing an example of the configuration of the semiconductor device according to the fourth embodiment. In FIG. 19, a configuration example combining the basic structure of the fourth embodiment shown in FIG. 16 and the first embodiment shown in FIG. 1 is shown. A concrete configuration thereof is as follows.

In FIG. 19, the dielectric film 201 is formed on the substrate 200. Then, the Cu film 202 is embedded in the dielectric film 201 via the barrier metal film 204 as the gate electrode 10 and further, the barrier metal film 206 is arranged to cover the top surface of the Cu film 202. The configuration content of the gate electrode 10 is the same as in FIG. 16.

The gate dielectric film 210 is arranged on the barrier metal film 206. The gate dielectric film 210 is formed on the barrier metal film 206 and the dielectric film 201. The oxide semiconductor film 220 is arranged on the gate dielectric film 210. The dielectric film 230 is arranged on the oxide semiconductor film 220. The dielectric film 230 is formed also on the gate dielectric film 210 to cover the oxide semiconductor film 220. In addition, the source electrode 12 and the drain electrode 14 are arranged in the dielectric film 230. The source electrode 12 and the drain electrode 14 are arranged apart from each other. The configuration content of the oxide semiconductor film 220, the dielectric film 230, and the source electrode 12 and the drain electrode 14 is the same as in FIG. 16.

In the example of FIG. 19, regarding the gate dielectric film 210 formed below the oxide semiconductor film 220, the thickness thereof in the region (As) below the source electrode 12 and the thickness thereof in the region (Ad) below the drain electrode 14 are formed thinner than the thickness thereof below the channel region (Ach) of the oxide semiconductor film 220 between the source electrode 12 and the drain electrode 14. In the example of FIG. 19, the thickness of the gate dielectric film 210 is made thinner in both regions (As and Ad) below the source electrode 12 and the drain electrode 14, but the present embodiment is not limited to such an example. The thickness on the lower side of at least one of the source electrode 12 and the drain electrode 14 (As and/or Ad) may be formed thinner than the thickness below the channel region (Ach). In other words, it does not matter whether the portion of the gate dielectric film 210 to be made thinner is only the portion below the source electrode 12, only the portion below the drain electrode 14, or both. By adopting such a configuration, the electric field applied to the oxide semiconductor film 220 below the source or drain electrode becomes stronger so that contact resistance can be reduced by concentration of carriers below the source or drain electrode. As a result, a decrease of the drain current can be inhibited. Further, the barrier metal film 206 is conducting to the Cu film 202 to integrally constitute the gate electrode 10 and thus, the gate length and the gate width (size in the depth direction of the drawing) can be widened (controlled) by the width of the barrier metal film 206 regardless of the width dimension of the Cu film 202. Other effects are the same as in the first embodiment.

In the method for fabricating a semiconductor device shown in FIG. 19, each process from the process of forming the dielectric film 201 to the process of forming the barrier metal film 206 is the same as the content described with reference to FIGS. 17A and 17B. Then, each process from the process of forming the gate dielectric film 210 to the process of forming openings in the dielectric film 230 is the same as in the first embodiment. Then, the content of the source/drain electrode formation process is as described above.

Figure 20:
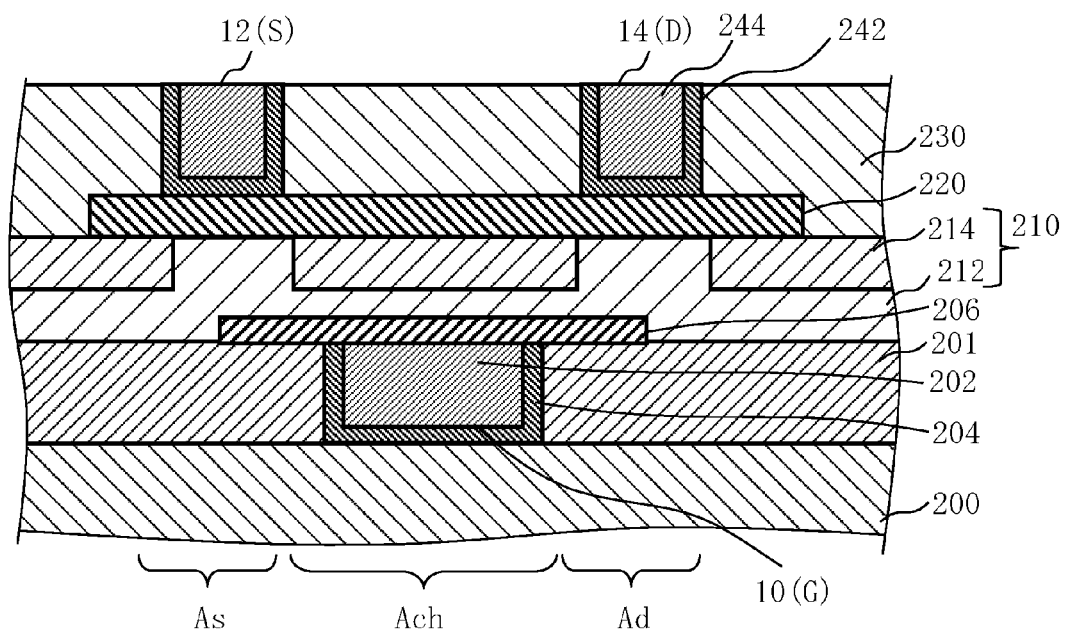
FIG. 20 is a sectional view showing another example of the configuration of the semiconductor device according to the fourth embodiment.

FIG. 20 is a sectional view showing another example of the configuration of the semiconductor device according to the fourth embodiment. In FIG. 20, a configuration example combining the basic structure of the fourth embodiment shown in FIG. 16 and the second embodiment shown in FIG. 10 is shown. A concrete configuration thereof is as follows.

In FIG. 20, the dielectric film 201 is formed on the substrate 200. Then, the Cu film 202 is embedded in the dielectric film 201 via the barrier metal film 204 as the gate electrode 10 and further, the barrier metal film 206 is arranged to cover the top surface of the Cu film 202. The configuration content of the gate electrode 10 is the same as in FIG. 16.

A laminated film of the first gate dielectric film 212 and the second gate dielectric film 214 is arranged on the barrier metal film 206 and the dielectric film 201 as the gate dielectric film 210. Here, the first gate dielectric film 212 and the second gate dielectric film 214 are formed such that the dielectric constant of the regions (As and Ad) below the source electrode 12 and the drain electrode 14 is higher than the dielectric constant of the region (Ach) below the channel region of the oxide semiconductor film 220 between the source electrode 12 and the drain electrode 14. In the example of FIG. 20, the gate dielectric film 210 is formed of only the first gate dielectric film 212 for the regions (As and Ad) below the source electrode 12 and the drain electrode 14. For the region (Ach) below the channel region, the gate dielectric film 210 is formed of the laminated film of the first gate dielectric film 212 and the second gate dielectric film 214. However, the method for making the dielectric constant higher is not limited to the above example and if the dielectric constant can be made higher than that of the region (Ach) below the channel region, the gate dielectric film 210 may be formed of a laminated film of the first gate dielectric film 212 and the second gate dielectric film 214 also for the regions (As and Ad) below the source electrode 12 and the drain electrode 14.

The oxide semiconductor film 220 is arranged on the first gate dielectric film 212 in the regions (As and Ad) below the source electrode 12 and the drain electrode 14 and on the second gate dielectric film 214 in the other region. The dielectric film 230 is arranged on the oxide semiconductor film 220. The dielectric film 230 is formed also on the gate dielectric film 210 to cover the oxide semiconductor film 220. In addition, the source electrode 12 and the drain electrode 14 are arranged in the dielectric film 230. The source electrode 12 and the drain electrode 14 are arranged apart from each other. The configuration content of the oxide semiconductor film 220, the dielectric film 230, and the source electrode 12 and the drain electrode 14 is the same as in FIG. 16.

In the example of FIG. 20, the gate dielectric film 210 is formed such that the dielectric constant of the regions (As and Ad) below the source electrode 12 and the drain electrode 14 is higher than the dielectric constant of the region (Ach) below the channel region of the oxide semiconductor film 220 between the source electrode 12 and the drain electrode 14 by combining the first gate dielectric film 212 and the second gate dielectric film 214. The combination content or the like of the first gate dielectric film 212 and the second gate dielectric film 214 is the same as in the second embodiment.

According to the example in FIG. 20, with a gate electric field below the source or drain electrode stronger than that below the channel, the contact resistance between the oxide semiconductor film 220 and the source electrode 12 or the drain electrode 14 can be decreased. That it does not matter whether the first gate dielectric film 212 is located only below the source electrode 12, only below the drain electrode 14, or below both of the source and drain electrodes is the same as in the second embodiment. Further, the barrier metal film 206 is conducting to the Cu film 202 to integrally constitute the gate electrode 10 and thus, the gate length and the gate width (size in the depth direction of the drawing) can be widened (controlled) by the width of the barrier metal film 206 regardless of the width dimension of the Cu film 202. Other effects are the same as in the second embodiment.

In the method for fabricating a semiconductor device shown in FIG. 20, each process from the process of forming the dielectric film 201 to the process of forming the barrier metal film 206 is the same as the content described with reference to FIGS. 17A and 17B. Then, each process from the process of forming the first gate dielectric film 212 to the process of forming openings in the dielectric film 230 is the same as in the second embodiment. Then, the content of the source/drain electrode formation process is as described above.

Figure 21:
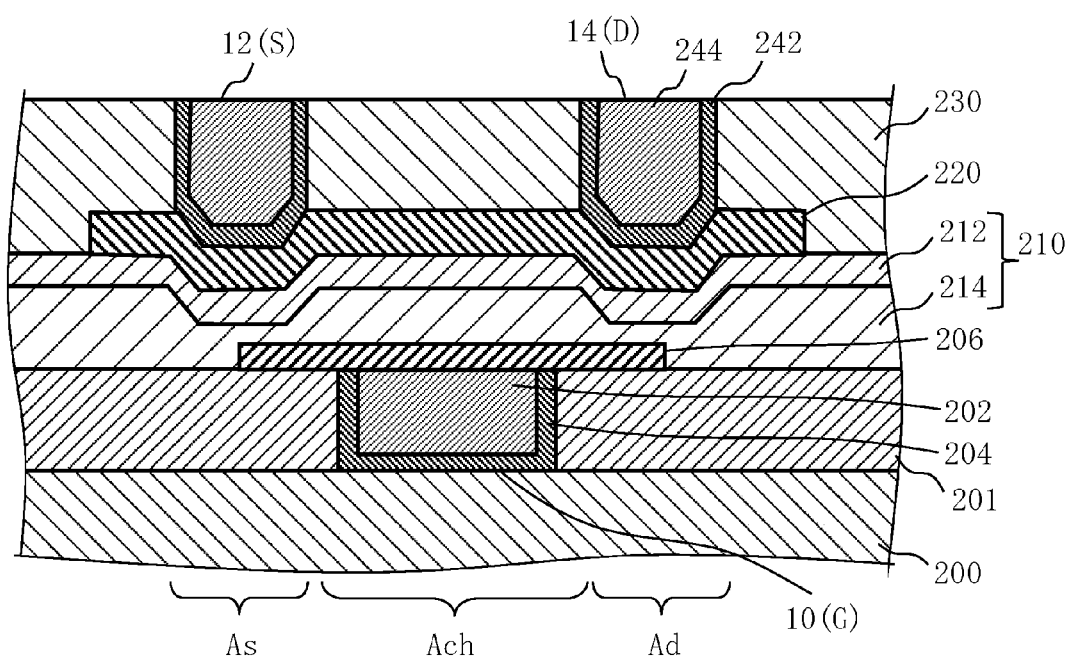
FIG. 21 is a sectional view showing still another example of the configuration of the semiconductor device according to the fourth embodiment.

FIG. 21 is a sectional view showing still another example of the configuration of the semiconductor device according to the fourth embodiment. In FIG. 21, a configuration example combining the basic structure of the fourth embodiment shown in FIG. 16 and the third embodiment shown in FIG. 13 is shown. A concrete configuration thereof is as follows.

In FIG. 21, the dielectric film 201 is formed on the substrate 200. Then, the Cu film 202 is embedded in the dielectric film 201 via the barrier metal film 204 as the gate electrode 10 and further, the barrier metal film 206 is arranged to cover the top surface of the Cu film 202. The configuration content of the gate electrode 10 is the same as in FIG. 16.

A laminated film of the first gate dielectric film 212 and the second gate dielectric film 214 is arranged on the barrier metal film 206 and the dielectric film 201 as the gate dielectric film 210. In the example of FIG. 21, like the third embodiment and contrary to the second embodiment, the second gate dielectric film 214 having a low dielectric constant is stacked so as to be arranged on the lower-layer side and the first gate dielectric film 212 having a high dielectric constant is stacked so as to be arranged on the upper-layer side. Here, the first gate dielectric film 212 and the second gate dielectric film 214 are formed such that the dielectric constant of the regions (As and Ad) below the source electrode 12 and the drain electrode 14 is higher than the dielectric constant of the region (Ach) below the channel region of the oxide semiconductor film 220 between the source electrode 12 and the drain electrode 14. In the example of FIG. 21, the thickness of the second gate dielectric film 214 on the lower-layer side in the regions (As and Ad) below the source electrode 12 and the drain electrode 14 is formed so as to be thinner than the thickness of the second gate dielectric film 214 in the region (Ach) below the channel region. By adopting such a configuration, the amount of the first gate dielectric film 212 becomes larger in the gate dielectric film 210 formed in the regions (As and Ad) below the source electrode 12 and the drain electrode 14 than in the region (Ach) below the channel region. Thus, the dielectric constant of the gate dielectric film 210 below the source/drain can be made higher than that below the channel region.

The oxide semiconductor film 220 is arranged on the first gate dielectric film 212. The dielectric film 230 is arranged on the oxide semiconductor film 220. The dielectric film 230 is formed also on the gate dielectric film 210 to cover the oxide semiconductor film 220. In addition, the source electrode 12 and the drain electrode 14 are arranged in the dielectric film 230. The source electrode 12 and the drain electrode 14 are arranged apart from each other. The configuration content of the oxide semiconductor film 220, the dielectric film 230, and the source electrode 12 and the drain electrode 14 is the same as in FIG. 16.

Sets of the first gate dielectric film 212 and the second gate dielectric film 214 are the same as in the second embodiment.

According to the example of FIG. 21, the gate electric field below the source or drain electrode can be made stronger than that below the channel by controlling the thickness and the dielectric constant of the gate dielectric film 210. Therefore, the contact resistance between the oxide semiconductor film 220 and the source electrode 12 or the drain electrode 14 can be decreased. Further, the barrier metal film 206 is conducting to the Cu film 202 to integrally constitute the gate electrode 10 and thus, the gate length and the gate width (size in the depth direction of the drawing) can be widened (controlled) by the width of the barrier metal film 206 regardless of the width dimension of the Cu film 202. Other effects are the same as in the third embodiment.

In the method for fabricating a semiconductor device shown in FIG. 21, each process from the process of forming the dielectric film 201 to the process of forming the barrier metal film 206 is the same as the content described with reference to FIGS. 17A and 17B. Then, each process from the process of forming the second gate dielectric film 214 to the process of forming openings in the dielectric film 230 is the same as in the third embodiment. Then, the content of the source/drain electrode formation process is as described above.

In the foregoing, the embodiments have been described with reference to concrete examples. However, the disclosure is not limited to such concrete examples. In the examples of FIGS. 16, 19 to 21, Cu is used as the material of the source electrode 12 and the drain electrode 14, but the embodiments are not limited to Cu. The source electrode and the drain electrode may be formed by using the same materials as those in the first to third embodiments.

In addition, all semiconductor devices and methods for fabricating a semiconductor device that include elements of the embodiments and whose design can be changed as appropriate by persons skilled in the art are included in the scope of the embodiments.

While techniques normally used in the semiconductor industry such cleaning before and after treatment are not described for convenience of description, it is needless to say that such techniques are included in the scope of the disclosure.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A semiconductor device comprising:
a source electrode;
a drain electrode arranged apart from the source electrode;
an oxide semiconductor film arranged below the source electrode and the drain electrode to connect the source electrode and the drain electrode;
a gate dielectric film formed below the oxide semiconductor film such that a thickness of the gate dielectric film below at least one of the source electrode and the drain electrode is less than a thickness of the gate dielectric film below a channel region of the oxide semiconductor film between the source electrode and the drain electrode; and
a gate electrode arranged below the gate dielectric film and formed in a position such that one of portions of the gate electrode overlaps with the source electrode and another one of the portions of the gate electrode overlaps with the drain electrode,
wherein the thickness of the gate dielectric film below the at least one of the source electrode and the drain electrode is 0.65 times the thickness of the gate dielectric film below the channel region of the oxide semiconductor film or less.

2. The device according to claim 1, wherein the thickness of the gate dielectric film below the at least one of the source electrode and the drain electrode is 0.39 times the thickness of the gate dielectric film below the channel region or less.

3. The device according to claim 1, wherein as the oxide semiconductor film, one of an InGaZnO film, an InZnO film, a ZnO film, a ZnAlO film, a ZnCuO film, a NiO film, an SnO film, a CuO film, a GaO film, and an InO film is used.

4. The device according to claim 1, wherein as the gate dielectric film, one of a silicon oxide ($SiO_2$) film, a silicon nitride (SiN) film, and a silicon oxynitride (SiON) film is used.

5. The device according to claim 1, wherein the thickness of the gate dielectric film below the at least one of the source electrode and the drain electrode is at least 2.5 nm.

6. A semiconductor device comprising:
a source electrode;
a drain electrode arranged apart from the source electrode;
an oxide semiconductor film arranged below the source electrode and the drain electrode to connect the source electrode and the drain electrode;
a gate dielectric film formed below the oxide semiconductor film such that a thickness of the gate dielectric film below at least one of the source electrode and the drain electrode is less than a thickness of the gate dielectric film below a channel region of the oxide semiconductor film between the source electrode and the drain electrode; and
a gate electrode arranged below the gate dielectric film and formed in a position such that one of portions of the gate electrode overlaps with the source electrode and another one of the portions of the gate electrode overlaps with the drain electrode,
wherein the gate dielectric film includes a first film and a second film formed on the first film, the second film having a higher dielectric constant than the first film, and
wherein a thickness of the first film below at least one of the source electrode and the drain electrode is less than a thickness of the first film below the channel region.

7. The device according to claim 6, wherein silicon oxide ($SiO_2$) is used as a material of the first film and
wherein at least one of silicon nitride (SiN) and aluminium oxide ($Al_2O_3$) is used as a material of the second film.

8. The device according to claim 6, wherein silicon nitride (SiN) is used as a material of the first film and
wherein at least one of $Ta_2O_5$, $TiO_2$, and $Y_2O_3$ is used as a material of the second film.

9. The device according to claim 6, wherein silicon oxide ($SiO_2$) is used as a material of the first film, and wherein at least one of $Ta_2O_5$, $TiO_2$, and $Y_2O_3$ is used as a material of the second film.

10. The device according to claim 1, wherein the gate electrode includes a copper (Cu) film and a barrier metal film covering a top surface of the copper film and
wherein a length of the barrier metal film in a channel length direction is longer than a channel length of the channel region.

11. The device according to claim 10, wherein as a material of the barrier metal film, at least one of titanium (Ti), tantalum (Ta), tantalum nitride (TaN), tungsten (W), titanium nitride (TiN), and tungsten nitride (WN) is used.

12. The device according to claim 6, wherein as the oxide semiconductor film, one of an InGaZnO film, an InZnO film, a ZnO film, a ZnAlO film, a ZnCuO film, a NiO film, an SnO film, a CuO film, a GaO film, and an InO film is used.

13. The device according to claim 6, wherein the gate electrode includes a copper (Cu) film and a barrier metal film covering a top surface of the copper film, and
wherein a length of the barrier metal film in a channel length direction is longer than a channel length of the channel region.

14. The device according to claim 13, wherein as a material of the barrier metal film, at least one of titanium (Ti), tantalum (Ta), tantalum nitride (TaN), tungsten (W), titanium nitride (TiN), and tungsten nitride (WN) is used.

\* \* \* \* \*